(12) United States Patent
Hwang et al.

(10) Patent No.: US 12,166,021 B2
(45) Date of Patent: Dec. 10, 2024

(54) MICRO LIGHT EMITTING DEVICE ARRAY AND METHOD OF MANUFACTURING THE SAME PRELIMINARY CLASS

(71) Applicant: SAMSUNG ELECTRONICS CO., LTD., Suwon-si (KR)

(72) Inventors: Kyungwook Hwang, Seoul (KR); Junsik Hwang, Hwaseong-si (KR); Hyunjoon Kim, Seoul (KR); Joonyong Park, Suwon-si (KR); Seogwoo Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/990,953

(22) Filed: Nov. 21, 2022

(65) Prior Publication Data

US 2023/0084493 A1 Mar. 16, 2023

Related U.S. Application Data

(62) Division of application No. 17/315,596, filed on May 10, 2021, now Pat. No. 11,610,872.

(30) Foreign Application Priority Data

Oct. 16, 2020 (KR) ......................... 10-2020-0134625

(51) Int. Cl.
*H01L 25/13* (2006.01)
*H01L 23/00* (2006.01)

(52) U.S. Cl.
CPC .............. *H01L 25/13* (2013.01); *H01L 24/83* (2013.01); *H01L 24/97* (2013.01);
(Continued)

(58) Field of Classification Search
CPC ......... H01L 25/13; H01L 24/83; H01L 24/97; H01L 2224/83203; H01L 2224/95136;
(Continued)

(56) References Cited

U.S. PATENT DOCUMENTS 10,418,527 B2 9/2019 Sasaki et al.
10,665,578 B2 * 5/2020 Huitema ................. H01L 33/62
(Continued)

FOREIGN PATENT DOCUMENTS

KR 10-2015-0044773 A 4/2015
KR 10-1620469 B1 5/2016
KR 10-2017-0026957 A 3/2017

*Primary Examiner* — Thanh T Nguyen
(74) *Attorney, Agent, or Firm* — Sughrue Mion, PLLC

(57) ABSTRACT

Provided is a method of manufacturing a micro light emitting device array. The method includes forming a display transfer structure including a transfer substrate and a plurality of micro light emitting devices, where the transfer substrate includes at least two first alignment marks; preparing a driving circuit board, the driving circuit board including a plurality of driving circuits and at least two second alignment marks, arranging the display transfer structure and the driving circuit board to face each other so that the at least two first alignment marks and the at least two second alignment marks face one another and bonding the plurality of micro light emitting devices of the display transfer structure to the plurality of driving circuits.

7 Claims, 34 Drawing Sheets

(52) U.S. Cl.
CPC .............. *H01L 2224/83203* (2013.01); *H01L 2224/95136* (2013.01); *H01L 2224/95146* (2013.01); *H01L 2924/12041* (2013.01)

(58) Field of Classification Search
CPC . H01L 2224/95146; H01L 2924/12041; H01L 33/62; H01L 2224/18; H01L 2224/95; H01L 2933/0066; H01L 33/0093; H01L 33/0095; H01L 25/0753; H01L 21/67144; H01L 21/6715; H01L 21/68; H01L 21/6835; H01L 25/167; H01L 27/1214; H01L 2221/68309; H01L 2221/68354
See application file for complete search history.

(56) References Cited

U.S. PATENT DOCUMENTS

| | | | |
|---|---|---|---|
| 10,847,083 B1* | 11/2020 | Pan | H01L 25/50 |
| 2011/0311276 A1* | 12/2011 | Yonehara | H01L 24/83 |
| | | | 438/458 |
| 2017/0062393 A1 | 3/2017 | Kim | |
| 2020/0220041 A1* | 7/2020 | Kim | H01L 33/0095 |
| 2020/0411471 A1* | 12/2020 | Chaji | H01L 24/80 |
| 2021/0384176 A1* | 12/2021 | Yin | H01L 25/0753 |
| 2021/0398960 A1* | 12/2021 | Zhong | H01L 25/0753 |

* cited by examiner

MICRO LIGHT EMITTING DEVICE ARRAY AND METHOD OF MANUFACTURING THE SAME PRELIMINARY CLASS

CROSS-REFERENCE TO RELATED APPLICATION

This application is a Divisional Application of U.S. application Ser. No. 17/315,596, filed May 10, 2021, which is based on and claims priority under 35 U.S.C. § 119 to Korean Patent Application No. 10-2020-0134625, filed on Oct. 16, 2020, in the Korean Intellectual Property Office, the disclosure of which is incorporated by reference herein in its entirety.

BACKGROUND

1. Field

The disclosure relates to micro light emitting device arrays and methods of manufacturing the same, and more particularly, to large-area micro light emitting device arrays formed by using alignment marks during a manufacturing process, and methods of manufacturing the same.

2. Description of Related Art

Light emitting diodes (LEDs) have low power consumption and are environmentally friendly. Owing to these advantages, industrial demand for LEDs has increased. LEDs are applied not only to lighting devices or light crystal display (LCD) backlights, but also to light emitting device display apparatuses. That is, display apparatuses using a micro-unit light emitting device have been developed. In manufacturing micro light emitting device display apparatuses, it is necessary to transfer a micro light emitting device to a substrate. A pick and place method is widely used to transfer the micro light emitting device to the substrate. However, in such a method, as the size of the micro light emitting device decreases and the size of a display increases, the productivity of the method decreases. Moreover, transferring a micro light emitting device that emits a plurality of color lights takes a lot of time because a transfer process is further required as many times as the number of colors.

In addition, as the area of the light emitting device display apparatus increases, the area of a driving circuit board to which the micro light emitting device needs to be transferred also increases. In order to form a display apparatus having a large area, when a transfer process for the micro light emitting device becomes longer, more time and cost may be incurred in manufacturing the display apparatus. Thus, a method of efficiently transferring a micro light emitting device to a driving circuit board is required.

SUMMARY

Provided are micro light emitting device arrays formed by using a display transfer structure including a plurality of micro light emitting devices aligned by a wet alignment method and alignment marks and a driving circuit board having the alignment marks formed thereon, and methods of manufacturing the same.

Additional aspects will be set forth in part in the description which follows and, in part, will be apparent from the description, or may be learned by practice of the example embodiments of the disclosure.

According to an aspect of the disclosure, there is provided a method of manufacturing a micro light emitting device array, the method including: forming a display transfer structure including a transfer substrate and a plurality of micro light emitting devices, wherein the transfer substrate includes at least two first alignment marks and the plurality of micro light emitting devices are arranged on the transfer substrate; preparing a driving circuit board, the driving circuit board including a plurality of driving circuits and at least two second alignment marks, wherein the plurality of driving circuits and the at least two second alignment marks are arranged in a region of the driving circuit board corresponding to a first area of a surface of the display transfer structure on which the plurality of micro light emitting devices are arranged, and the at least two second alignment marks are arranged in a same manner as the at least two first alignment marks; arranging the display transfer structure and the driving circuit board to face each other so that the at least two first alignment marks and the at least two second alignment marks face each other; and bonding the plurality of micro light emitting devices of the display transfer structure to the plurality of driving circuits.

The at least two first alignment marks are symmetrically arranged on the transfer substrate.

A number of the at least two first alignment marks formed on the transfer substrate is same as a number of the at least two second alignment marks formed on the driving circuit board.

A second area of an upper surface of the driving circuit board is same as the first area of an upper surface of the display transfer structure.

The method further includes: forming a plurality of bonding structures by bonding the driving circuit board to the plurality of micro light emitting devices by repeatedly performing the forming the display transfer structure, the preparing the driving circuit board, the arranging the display transfer structure and the driving circuit board to face each other and the bonding the plurality of micro light emitting devices of the display transfer structure to the plurality of driving circuits, and after forming the plurality of bonding structures, connecting the plurality of bonding structures to each other.

A second area of an upper surface of the driving circuit board is greater than the first area of an upper surface of the display transfer structure that faces the upper surface of the driving circuit board.

The driving circuit board includes a plurality of sub-regions corresponding to the first area of the display transfer structure and each of the plurality of sub-regions includes the at least two second alignment marks.

The forming the display transfer structure, the preparing the driving circuit board, the arranging the display transfer structure and the driving circuit board to face each other and the bonding the plurality of micro light emitting devices of the display transfer structure to the plurality of driving circuits are sequentially and repeatedly performed on the plurality of sub-regions until the plurality of micro light emitting devices are bonded to all of a plurality of driving circuits included in all of the plurality of sub-regions of the driving circuit board.

The at least two first alignment marks are formed on edges of the transfer substrate.

One of the at least two first alignment marks and one of the at least two second alignment marks that face each other have surfaces having a same shape.

One of a first first alignment mark among the at least two first alignment marks and a first second alignment mark among the at least two second alignment marks that face each other has an embossed shape and the other of the first first alignment mark and the first second alignment mark has an intaglio shape.

Surfaces of the at least two first alignment marks and the at least two second alignment marks that face each other have at least one shape of various figures, characters, or numbers.

The bonding the plurality of micro light emitting devices of the display transfer structure to the plurality of driving circuits includes: pre-bonding the plurality of micro light emitting devices to the plurality of driving circuits by placing the display transfer structure on the driving circuit board; applying pressure between the plurality of micro light emitting devices and the driving circuit board; and performing a thermal treatment on the plurality of micro light emitting devices and the driving circuit board.

The bonding the plurality of micro light emitting devices of the display transfer structure to the plurality of driving circuits includes bonding the plurality of micro light emitting devices to the plurality of driving circuits using an adhesive material.

The forming the display transfer structure includes: preparing the transfer substrate including a plurality of grooves, supplying a liquid to the plurality of grooves, supplying the plurality of micro light emitting devices to the transfer substrate, and scanning the transfer substrate using an absorbing material capable of absorbing the liquid to align the plurality of micro light emitting devices on the plurality of grooves.

The supplying of the liquid is performed using at least one of a spray method, a dispensing method, an inkjet dot method, and a method of flowing the liquid onto the transfer substrate.

The supplying of the liquid and the supplying of the plurality of micro light emitting devices are performed in a single process, and the supplying of the liquid and the supplying of the plurality of micro light emitting devices include supplying a solution including the liquid and the plurality of micro light emitting devices to the transfer substrate.

The supplying of the solution to the transfer substrate is performed using at least one of a spray method, a dispensing method, an inkjet dot method, and a method of flowing the liquid onto the transfer substrate.

The supplying of the plurality of micro light emitting devices includes wetting the absorbing material in a solution including the liquid and the plurality of micro light emitting devices to adsorb the plurality of micro light emitting devices and the liquid onto the absorbing material and allowing the absorbing material to come into contact with the transfer substrate and to pass through the transfer substrate.

The supplying of the plurality of micro light emitting devices includes attaching the plurality of micro light emitting devices to the absorbing material and allowing the absorbing material to come into contact with the transfer substrate.

The supplying of the plurality of micro light emitting devices includes preparing a solution by submerging the plurality of micro light emitting devices in another liquid and providing the solution to the transfer substrate.

At least one of the supplying of the liquid, the supplying of the plurality of micro light emitting devices, and the scanning is repeatedly performed a plurality of times.

The scanning of the transfer substrate includes allowing the absorbing material to come into contact with the transfer substrate and to pass across the plurality of grooves.

The scanning of the transfer substrate includes at least one of a reciprocating motion, a translating motion, a rotating motion, a rolling motion, rubbing, and spinning of the absorbing material or includes at least one of a rotating motion, a translating motion, a rolling motion, and spinning of the transfer substrate.

The plurality of micro light emitting devices includes at least one electrode on one surface of the respective micro light emitting device, and the at least one electrode is arranged toward an upper opening of the plurality of grooves.

According to another aspect of the disclosure, there is provided a micro light emitting device array including: a substrate comprising a plurality of sub-regions; a plurality of micro light emitting devices arranged on the plurality of sub-regions; a plurality of driving circuits arranged on the substrate to be electrically connected to the plurality of micro light emitting devices; and a plurality of alignment marks arranged on the substrate, wherein at least two alignment marks from among the plurality of alignment marks are arranged in each of the plurality of sub-regions.

The at least two alignment marks are symmetrically arranged in each of the plurality of sub-regions.

Areas of the plurality of sub-regions are same.

A first number of a plurality of micro light emitting devices arranged in a first sub-region from among the plurality of sub-regions and a second number of a plurality of micro light emitting devices arranged in a second sub-region from among the plurality of sub-regions are same.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
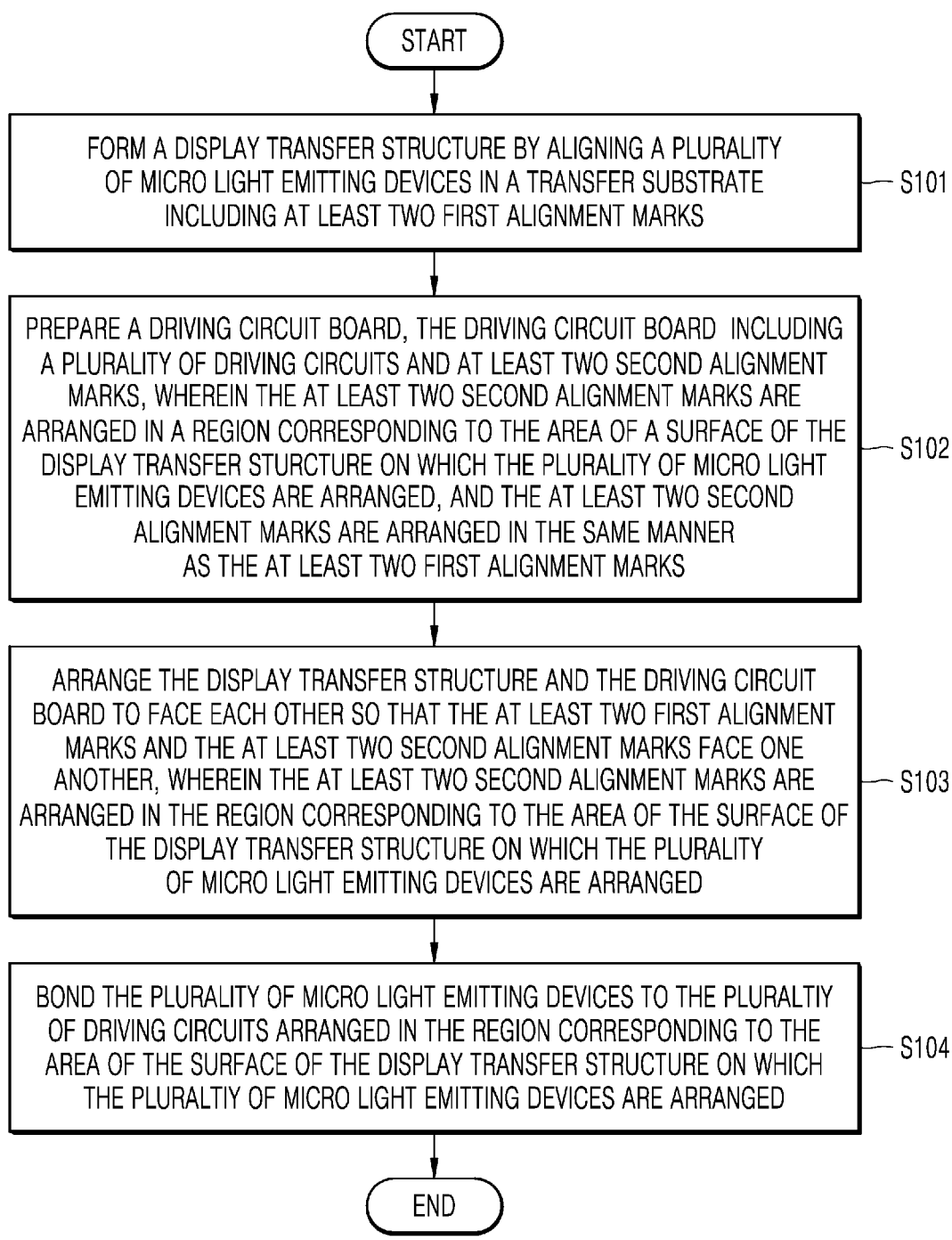
FIG. 1 is a flowchart schematically illustrating a method of manufacturing a micro light emitting device array according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

In the drawings, the size or thickness of each component in the drawings may be exaggerated for clarity of description.

Hereinafter, what is described as being "above" or "on," it may include not only what is directly "above" or "on," but also what is "above" or "on" in a non-contact manner. A singular expression includes a plural expression, unless the context clearly indicates otherwise. Also, when a part is said to "include" a certain component, this means that other components may be further included rather than excluding other components unless otherwise stated.

The use of the term "above-described" and similar designating terms may correspond to both the singular and the plural. The use of all examples or illustrative terms is merely for describing in detail the technical idea, and the scope is not limited by the above-described examples or illustrative terms unless limited by the claims.

It will be understood that although the terms "first," "second," etc. may be used herein to describe various components, these components should not be limited by these terms. These components are only used to distinguish one component from another.

Terms such as " . . . unit" and "module" mean units that process at least one function or operation, which may be implemented as hardware or software, or as a combination of hardware and software.

In the example embodiment, specific implements described are examples, and do not limit the technical scope in any way. For the sake of brevity of the specification, descriptions of conventional electronic configurations, control systems, software, and other functional aspects of the systems will be omitted. In addition, connections or connecting members of lines between the components shown in the drawings are illustrative representations of functional connections and/or physical or circuit connections, and may be represented as alterative or additional various functional connections, physical connections, or circuit connections in an actual device.

Steps constituted a method may be performed in any suitable order, unless there is a clear statement that the steps in the method should be performed in the order described. In addition, the use of all exemplary terms (e.g., etc.) is to simply describe the technical idea in detail, and the scope of the rights is not limited by these terms, unless limited by the claims.

Figure 2:
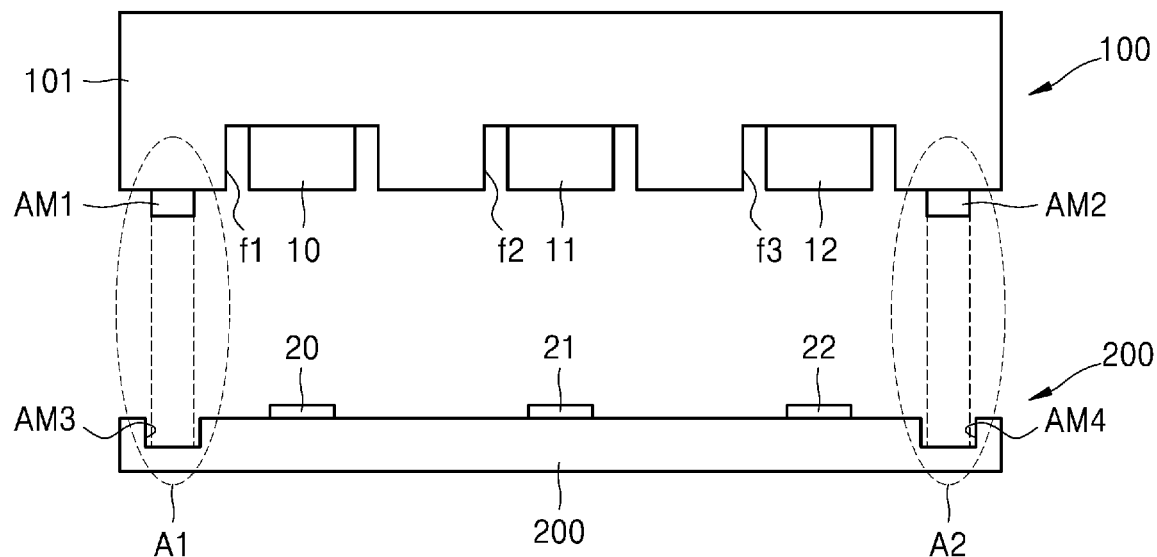
FIG. 2 schematically illustrates a state in which a display transfer structure and a driving circuit board are arranged to face each other according to the method of manufacturing a micro light emitting device array of FIG. 1 according to an example embodiment.
Figure 3:
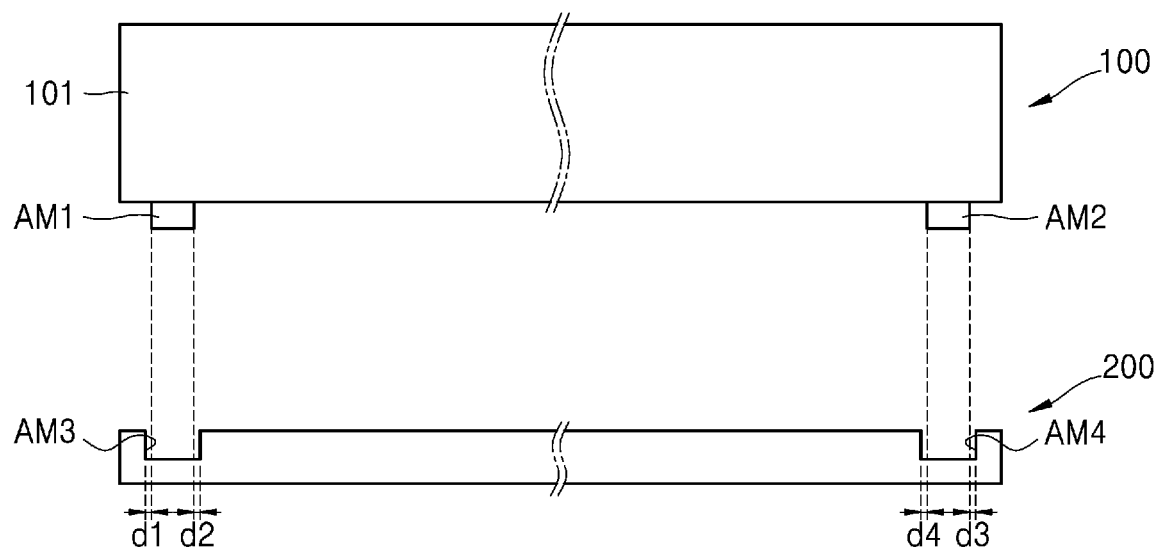
FIG. 3 is an enlarged view of a first area and a second area of FIG. 2 according to an example embodiment.
Figure 4:
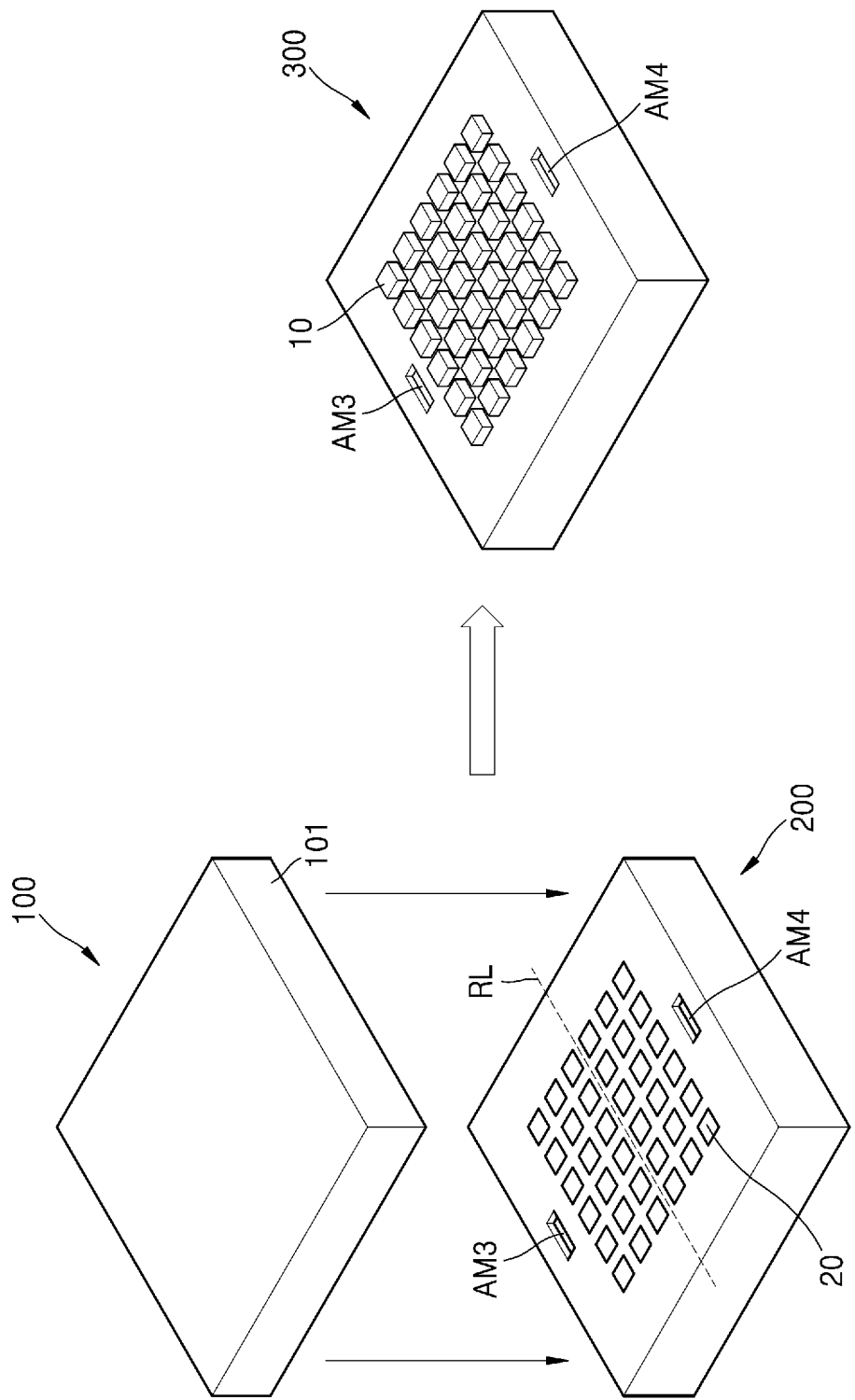
FIG. 4 schematically illustrates a state in which a micro light emitting device and a driving circuit are bonded to each other according to the method of manufacturing a micro light emitting device array of FIG. 1 according to an example embodiment.

FIG. 1 is a flowchart schematically illustrating a method of manufacturing a micro light emitting device array according to an example embodiment. FIG. 2 schematically illustrates a state in which a display transfer structure 100 and a driving circuit board 200 are arranged to face each other according to the method of manufacturing a micro light emitting device array of FIG. 1. FIG. 3 is an enlarged view of a first area A1 and a second area A2 of FIG. 2. FIG. 4 schematically illustrates a state in which a micro light emitting device and a driving circuit are bonded to each other according to the method of manufacturing a micro light emitting device array of FIG. 1.

Referring to FIGS. 1 and 2, the method of manufacturing a micro light emitting device array according to an example embodiment may include a first operation (S101) of forming a display transfer structure 100 including a transfer substrate 101 and a plurality of micro light emitting devices 10, 11, and 12. According to an example embodiment, the transfer substrate 101 includes at least two first alignment marks AM1 and AM2, and the plurality of micro light emitting devices 10, 11, and 12 are arranged on the transfer substrate 101. According to an example embodiment, the method includes a second operation (S102) of preparing a driving circuit board 200. According to an example embodiment, the driving circuit board 200 includes a plurality of driving circuits 20, 21, and 22 and at least two second alignment marks AM3 and AM4. According to an example embodiment, at least two second alignment marks AM3 and AM4 are arranged in a region corresponding to the area of a surface of the display transfer structure 100 on which the plurality of micro light emitting devices 10, 11, and 12 are arranged, Moreover, the at least two second alignment marks AM3 and AM4 are arranged in the same manner as at least two first alignment marks AM1 and AM2 so as to corresponding to each other. According to an example embodiment, the method includes a third operation (S103) of arranging the display transfer structure 100 and the driving circuit board 200 to face each other so that at least two first alignment marks AM1 and AM2 and at least two second alignment marks AM3 and AM4 face one another. According to an example embodiment, the method includes a fourth step (S104) of bonding the plurality of micro light emitting devices 10, 11, and 12 of the display transfer structure 100 to the plurality of driving circuits 20, 21, and 22. According to an example embodiment, the plurality of driving circuits 20, 21, and 22 are arranged in the region corresponding to the area of the surface of the display transfer structure 100 on which the plurality of micro light emitting devices 10, 11, and 12 arranged. According to another example embodiment, the order of the operations is not limited to the illustrated in FIG. 1.

In the first operation (S101), the display transfer structure 100 used to transfer the plurality of micro light emitting devices 10, 11, and 12 to the driving circuit board 200 may be formed. For example, in the first operation (S101), the plurality of micro light emitting devices 10, 11, and 12 may be arranged on the upper surface of the transfer substrate 101. Also, referring to FIG. 2, at least two first alignment marks AM1 and AM2 that may be used to adjust the relative position of the transfer substrate 101 to the driving circuit board 200 may be formed on the upper surface of the transfer substrate 101. At least two first alignment marks AM1 and AM2 may have an embossed shape. However, example embodiments are not limited thereto, and at least two first alignment marks AM1 and AM2 may have an intaglio shape. Alternatively, part of at least two first alignment marks AM1 and AM2 may have an embossed shape, and the other part thereof may have an intaglio shape. At least two first alignment marks AM1 and AM2 may be symmetrically arranged on the transfer substrate 101. At least two first alignment marks AM1 and AM2 may be formed on edges of the transfer substrate 101. Although three micro light emitting devices 10, 11 and 12 are shown in FIG. 2, this is for convenience of description and the disclosure is not limited thereto, and as such, the number of a plurality of micro light emitting devices 10, 11, and 12 may be numerous.

There may be various methods of forming the display transfer structure 100. The display transfer structure 100 may be formed by arranging the plurality of micro light emitting devices 10, 11, and 12 on the upper surface of the transfer substrate 101. The display transfer structure 100 may be formed by arranging the plurality of micro light emitting devices 10, 11, and 12 on the transfer substrate 101 in the form of a two-dimensional array. As a method of arranging the plurality of micro light emitting devices 10, 11, and 12 on the upper surface of the transfer substrate 101, there may be a stamping method, an inkjet printing method, a wet alignment method, or the like. For example, the display transfer structure 100 of FIG. 2 may be formed by arranging the plurality of micro light emitting devices 10, 11, and 12 in a plurality of grooves f1, f2, and f3 formed on the upper surface of the transfer substrate 101 by using the wet alignment method. A method of forming the display transfer structure 100 by using the wet alignment method will be described with reference to FIGS. 20 through 34.

In the operation step (S102), the driving circuit board 200 including the plurality of driving circuits 20, 21, and 22 may be prepared. The plurality of driving circuits 20, 21, and 22 may be arranged on the upper surface of the driving circuit board 200. The plurality of driving circuits 20, 21, and 22 may drive the plurality of micro light emitting devices 10, 11, and 12 to emit light. The plurality of driving circuits 20, 21, and 22 may correspond to the plurality of micro light emitting devices 10, 11, and 12, respectively. For example, the plurality of driving circuits 20, 21, and 22 may be arranged on the driving circuit board 200 in the form of a two-dimensional array. Although three driving circuits 20, 21, and 22 are shown in FIG. 2, this is for convenience of description and the disclosure is not limited thereto, and as such, the number of the plurality of driving circuits 20, 21, and 22 may be numerous.

The areas of the upper surface of the driving circuit board 200 and the upper surface of the transfer substrate 101 that face each other may be the same. Thus, the area of the upper surface of the driving circuit board 200 may correspond to the area of the surface of the display transfer structure 100 on which the plurality of micro light emitting devices 10, 11, and 12 are arranged. For example, the area of the upper surface of the transfer substrate 101 may be greater than 4 inches. Thus, the plurality of micro light emitting devices 10, 11, and 12 may be arranged on the upper surface of the transfer substrate 101 having a greater area than 4 inches. Also, the area of the upper surface of the driving circuit board 200 may be greater than 4 inches, which is the same as the upper surface of the display transfer structure 100.

However, example embodiments are not limited thereto, and the area of the upper surface of the driving circuit board 200 may be greater than the area of the upper surface of the transfer substrate 101. For example, when the upper surface of the transfer substrate 101 is 4 inches, the area of the upper surface of the driving circuit board 200 that faces the transfer substrate 101 may be 40 inches. In this case, by performing a bonding operation of the plurality of micro light emitting devices 10, 11, and 12 using the display transfer structure 100 several times, the plurality of micro light emitting devices 10, 11, and 12 may be bonded to the entire upper surface of the driving circuit board 200. This will be described with reference to FIGS. 11 through 16. At least two second alignment marks AM3 and AM4 may be formed in the region of the upper surface of the driving circuit board 200 corresponding to the area of the surface of the display transfer structure 100 on which the plurality of micro light emitting devices 10, 11, and 12 are arranged, wherein the at least two second alignment marks AM3 and AM4 are arranged in the same manner as at least two first alignment marks AM1 and AM2 arranged on the transfer substrate 101. The number of at least two first alignment marks AM1 and AM2 and the number of at least two second alignment marks AM3 and AM4 formed in the region corresponding to the area of the surface of the display transfer structure 100 on which the plurality of micro light emitting devices 10, 11, and 12 are arranged, on the driving circuit board 200 may be the same.

Referring to FIG. 2, at least two second alignment marks AM3 and AM4 formed in the region of the upper surface of the driving circuit board 200 corresponding to the area of the surface of the display transfer structure 100 on which the plurality of micro light emitting devices 10, 11, and 12 are arranged may be disposed to face at least two first alignment marks AM1 and AM2. any one of at least two first alignment marks AM1 and AM2 and any one of the at least two second alignment marks AM3 and AM4 that face each other have surfaces having the same shape. For example, shapes (e.g., rectangles) of surfaces of the first alignment mark AM1 and the second alignment mark AM3 that face each other may be the same. Also, shapes (e.g., rectangles) of surfaces of the first alignment mark AM2 and the second alignment mark AM4 that face each other may be the same. However, embodiments are not limited thereto, and the shapes of at least two first alignment marks AM1 and AM2 and at least two second alignment marks AM3 and AM4 may have various shapes other than rectangles, and this will be described later with reference to FIGS. 18 and 19.

At least two second alignment marks AM3 and AM4 may have an intaglio shape. However, example embodiments are not limited thereto, and at least two second alignment marks AM3 and AM4 may have an embossed shape. Alternatively, part of at least two second alignment marks AM3 and AM4 may have an embossed shape, and the other part thereof may have an intaglio shape.

In the third operation (S103), the upper surface of the display transfer structure 100 and the upper surface of the driving circuit board 200 may be disposed to face each other. As described above, the upper surface of the display transfer structure 100 may be a surface on which a plurality of micro optical devices 10, 11 and 12 are arranged, and the upper surface of the driving circuit board 100 may be a surface on which the plurality of driving circuits 20, 21 and 22 are arranged. For example, in the third operation (S103), the upper surface of the display transfer structure 100 may be disposed to face a region of the upper surface of the driving circuit board 200 corresponding to the area of the surface of the display transfer structure 100 on which the plurality of micro light emitting devices 10, 11 and 12 are arranged. Referring to FIG. 2, the area of the upper surface of the driving circuit board 200 may be the same as the area of the upper surface of the display transfer structure 100. Thus, when the upper surface of the display transfer structure 100 is disposed to face the upper surface of the driving circuit board 200, the upper surface of the display transfer structure 100 may face the entire upper surface of the driving circuit board 200.

In the third operation (S103), when the display transfer structure 100 and the driving circuit board 200 are disposed to face each other, at least two first alignment marks AM1 and AM2 and at least two second alignment marks AM3 and AM4 may be disposed to face each other. For example, referring to FIG. 3, at least two first alignment marks AM1 and AM2 having an embossed shape formed on the upper surface of the transfer substrate 101 and at least two second alignment marks AM3 and AM4 having the intaglio shape formed on the upper surface of the driving circuit board 200 may be disposed to face each other. However, example embodiments are not limited thereto, and at least two first alignment marks AM1 and AM2 may have an intaglio shape, and at least two second alignment marks AM3 and AM4 may have an embossed shape.

According to another example embodiment, at least two first alignment marks AM1 and AM2 may have be a protrusion, and at least two second alignment marks AM3 and AM4 may be an opening. According to another example embodiment, at least two first alignment marks AM1 and AM2 may have be an opening, and at least two second alignment marks AM3 and AM4 may be a protrusion.

As shown in FIG. 3, the width of at least two second alignment marks AM3 and AM4 having the intaglio shape may be greater than the width of at least two first alignment marks AM1 and AM2 having the embossed shape. For example, when the first alignment mark AM1 is seated inside the second alignment mark AM3, the first alignment mark AM1 may be apart from the left inner surface of the second alignment mark AM3 by a first distance d1 and may be apart from the right inner surface of the second alignment mark AM3 by a second distance d2. Also, when the first alignment mark AM2 is seated inside the second alignment mark AM4, the first alignment mark AM2 may be apart from the right inner surface of the second alignment mark AM4 by a third distance d3 and may be apart from the left inner surface of the second alignment mark AM4 by a fourth distance d4. In this case, the display transfer structure 100 and the driving circuit board 200 may be disposed so that the first distance d1 and the third distance d3 may be the same and the second distance d2 and the fourth distance d4 may be the same.

In this way, relative positions of at least two first alignment marks AM1 and AM2 and at least two second alignment marks AM3 and AM4 may be properly adjusted so that the plurality of micro light emitting devices 10, 11, and 12 may be arranged at positions corresponding to the plurality of driving circuits 20, 21, and 22.

In the fourth operation (S104), after the display transfer structure 100 and the driving circuit board 200 that face each other are in close contact with each other, the plurality of micro light emitting devices 10 may be bonded to the driving circuit board 200. After the display transfer structure 100 is in close contact with the driving circuit board 200, the transfer substrate 101 may be removed so that the plurality of micro light emitting devices 10 alone may be bonded to the driving circuit board 200.

For example, referring to FIG. 4, the display transfer structure 100 is in close contact with the region of the upper surface of the driving circuit board 200 corresponding to the area of the surface of the display transfer structure 100 on which the plurality of micro light emitting devices 10 are arranged, thereby bonding the plurality of micro light emitting devices 10 to the driving circuit board 200. Thus, the plurality of micro light emitting devices 10 may be arranged on the driving circuit board 200 so that a bonding structure 300 may be formed. The bonding structure 300 may be referred to as a micro light emitting device array. The example embodiment shown in FIG. 4 illustrates the case where the areas of the upper surface of the display transfer structure 100 and the upper surface of the driving circuit board 200 are the same. For example, the area of the upper surface of the transfer substrate 101 may be greater than 4 inches. Thus, by using the display transfer structure 100, the plurality of micro light emitting devices 10 that may be arranged in a region having a greater area than 4 inches may be bonded to the driving circuit board 200 at once. Also, for example, the area of the upper surface of the transfer substrate 101 may be greater than 8 inches and less than 9 inches. In this case, by using the display transfer structure 100, the plurality of micro light emitting devices 10 that may be arranged in a region having an area that is greater than 8 inches and less than 9 inches may be bonded to the driving circuit board 200. In this way, as the size of the transfer substrate 101 is increased, the display transfer structure 100 capable of transferring a plurality of more micro light emitting devices 10 to the driving circuit board 200 at once may be formed.

Although a plurality of (thirty-six) micro light emitting devices 10 arranged on the bonding structure 300 are shown in FIG. 4, this is for convenience of description, and the number of the plurality of micro light emitting devices 10 is not limited thereto. For example, the number of the plurality of micro light emitting devices 10 that may be arranged on the transfer substrate 101 may be numerous.

The plurality of driving circuits 20 may be arranged on the upper surface of the driving circuit board 200 in the form of a two-dimensional array. Also, at least two second alignment marks AM3 and AM4 may be formed on edges of the driving circuit board 200. At least two second alignment marks AM3 and AM4 may be arranged at positions in which they are symmetrical to each other with respect to a central symmetry axis RL of the driving circuit board 200. According to an example embodiment, at least two first alignment marks AM1 and AM2 may be arranged on the transfer substrate 101. At least two first alignment marks AM1 and AM2 may be formed to face at least two second alignment marks AM3 and AM4.

Figure 5:
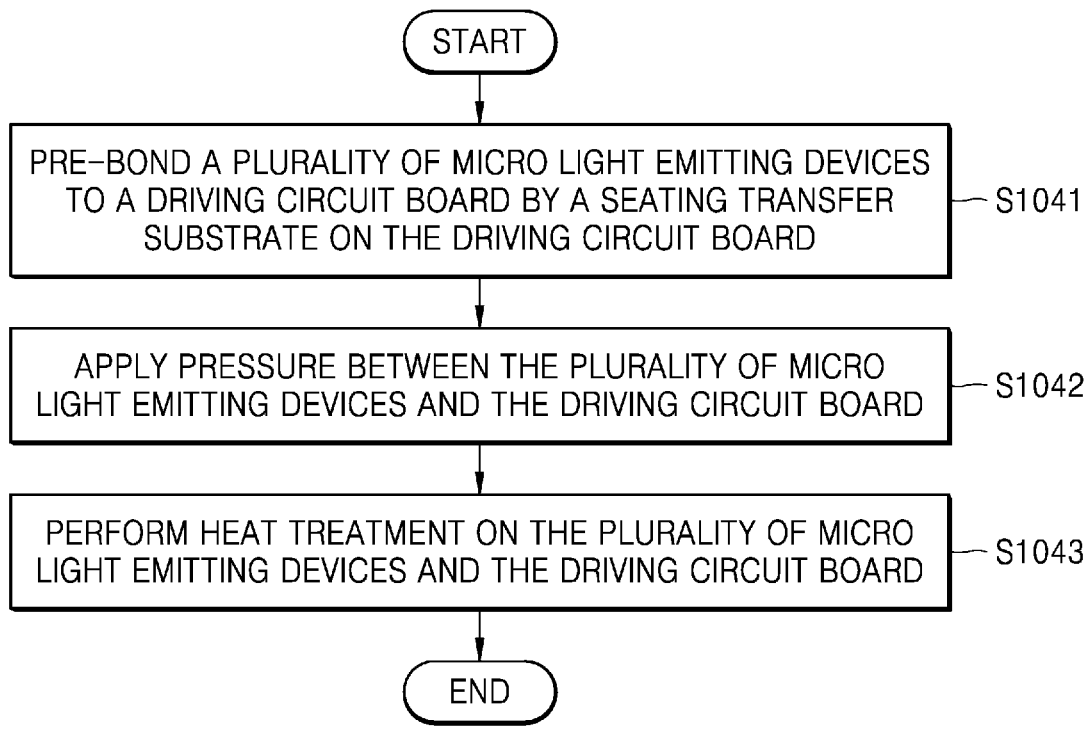
FIG. 5 is a flowchart schematically illustrating an example of a bonding method of a fourth step of FIG. 1 according to an example embodiment.
Figure 6:
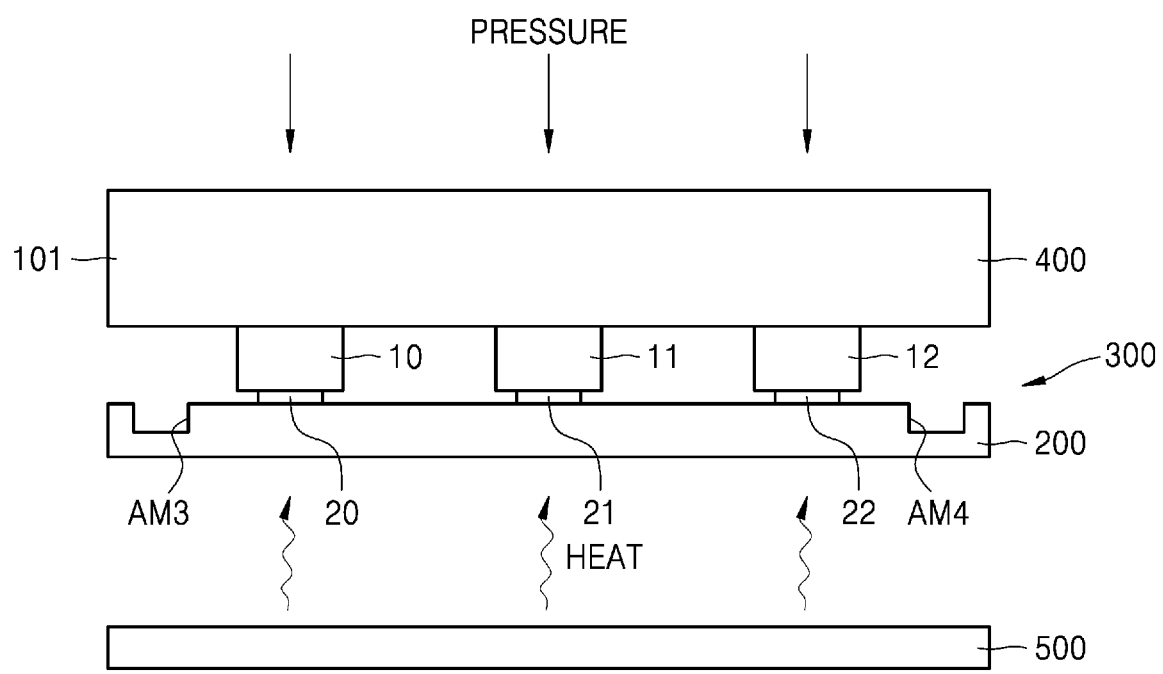
FIG. 6 schematically illustrates the bonding method of FIG. 5 according to an example embodiment.

FIG. 5 is a flowchart schematically illustrating an example bonding method that may be applied to the fourth operation (S104) of FIG. 1. FIG. 6 is provided to schematically describe the bonding method of FIG. 5.

Referring to FIG. 5, the example bonding method that may be applied to the fourth operation (S104) of FIG. 1 may include, for example, pre-bonding the plurality of micro light emitting devices 10, 11, and 12 to the plurality of driving circuits 20, 21, and 22 by seating or placing the display transfer structure 100 on the driving circuit board 200 (S1041), applying pressure between the plurality of micro light emitting devices 10, 11, and 12 and the driving circuit board 200 (S1042), and performing thermal treatment on the plurality of micro light emitting devices 10, 11, and 12 and the driving circuit board 200 (S1043).

In the pre-bonding operation (S1041), the display transfer structure 100 and the driving circuit board 200 that face each other of FIG. 2 may be in close contact with each other so that the plurality of micro light emitting devices 10, 11, and 12 may be pre-bonded to the plurality of driving circuits 20, 21, and 22. According to an example embodiment, at least one electrode may be arranged on a plurality of micro light emitting devices 10, 11, and 12. At least one electrode arranged on the plurality of micro light emitting devices 10, 11, and 12 may be electrically connected to the plurality of driving circuits 20, 21, and 22. Thus, a bonding structure 300 may be formed. A configuration in which at least one electrode arranged on the plurality of micro light emitting devices 10, 11 and 12 and the driving circuits 20, 21 and 22 are electrically connected to each other, will be described later with reference to FIGS. 36 through 38.

Referring to FIG. 6, heat and pressure may be applied to a bonding structure 300 formed by pre-bonding the plurality of micro light emitting devices 10, 11, and 12 to the driving circuit board 200. For example, a pressurizer 400 may be arranged on the upper surface of the driving circuit board 200, and the pressurizer 400 may be in close contact with the plurality of micro light emitting devices 10, 11, and 12. In this way, pressure may be applied between the plurality of micro light emitting devices 10, 11, and 12 and the driving circuit board 200 by using the pressurizer 400. Also, a heat generating device 500 may be arranged on a lower surface of the driving circuit board 200, and heat from the heat generating device 500 may be applied to the bonding structure 300. In this way, heat treatment may be performed on the plurality of micro light emitting devices 10, 11, and 12 and the driving circuit board 200 by using the heat generating device 500.

As in the method shown in FIG. 5, by using a bonding method in which pressure and heat treatment are performed, the plurality of micro light emitting devices 10, 11, and 12 may be firmly bonded to the driving circuit board 200.

Figure 7:
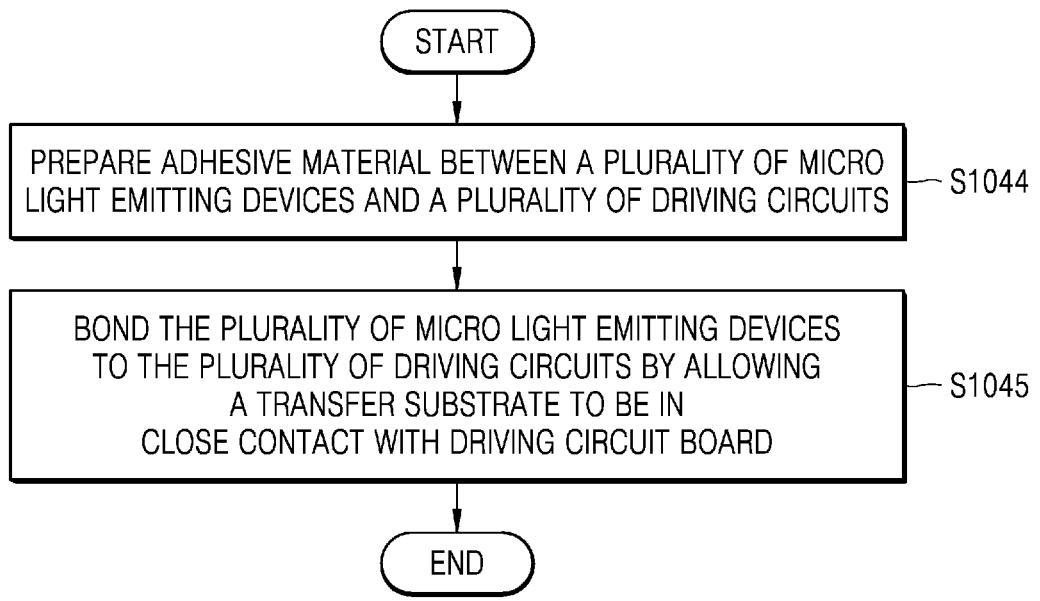
FIG. 7 is a flowchart schematically illustrating another example bonding method that may be applied to the fourth step of FIG. 1 according to an example embodiment.
Figure 8:
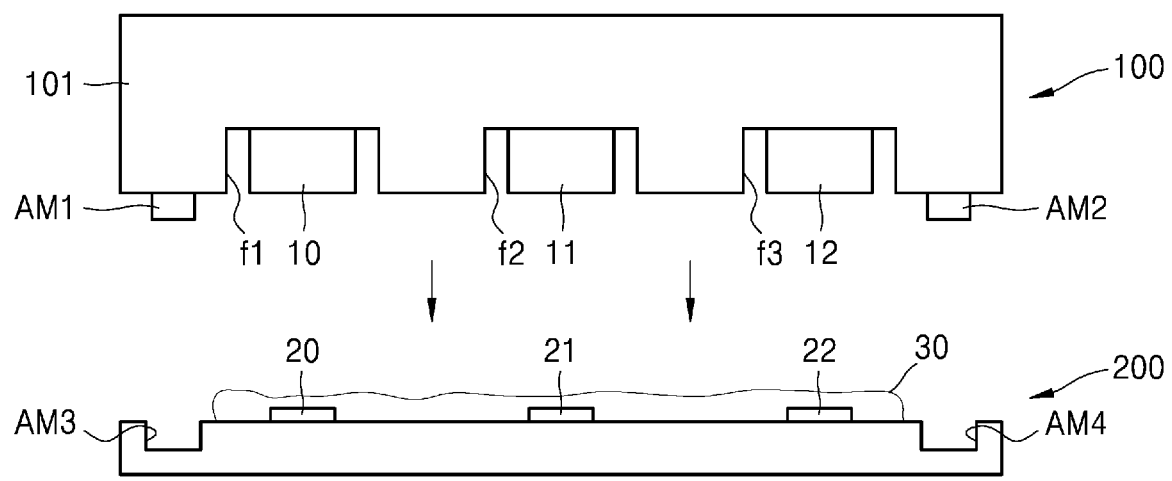
FIG. 8 schematically illustrates the bonding method of FIG. 7 according to an example embodiment.

FIG. 7 is a flowchart schematically illustrating another example bonding method that may be applied to the fourth operation (S104) of FIG. 1. FIG. 8 is provided to schematically describe the bonding method of FIG. 7.

Referring to FIG. 7, the example bonding method that may be applied to the fourth operation (S104) of FIG. 1 may include, for example, preparing an adhesive material 30 between the plurality of micro light emitting devices 10, 11, and 12 and the plurality of driving circuits 20, 21, and 22 (S1044) and bonding the plurality of micro light emitting devices 10, 11, and 12 to the plurality of driving circuits 20, 21, and 22 using the adhesive material by allowing the transfer substrate 101 to be in close contact with the driving circuit board 200 (S1045).

As shown in FIG. 8, the adhesive material 30 may be provided to cover the entire region in which the plurality of driving circuits 20, 21 and 22 are arranged on the driving circuit board 200. For example, the adhesive material 30 may be provided to cover a region between the plurality of driving circuits 20, 21, and 22 in addition to the plurality of driving circuits 20, 21, and 22. However, example embodiments are not limited thereto, and the adhesive material 30 may be provided to cover the plurality of driving circuits 20, 21, and 22 alone except for the region between the plurality of driving circuits 20, 21, and 22. In this case, the adhesive material 30 may be provided in the arrangement in the form of a two-dimensional array according to the arrangement in the form of the two-dimensional array of the plurality of driving circuits 20, 21, and 22.

The adhesive material 30 may include a conductive material of an adhesive component. For example, the adhesive material 30 may include a conductive paste, an anisotropic conductive film (ACF), etc.

Figure 9:
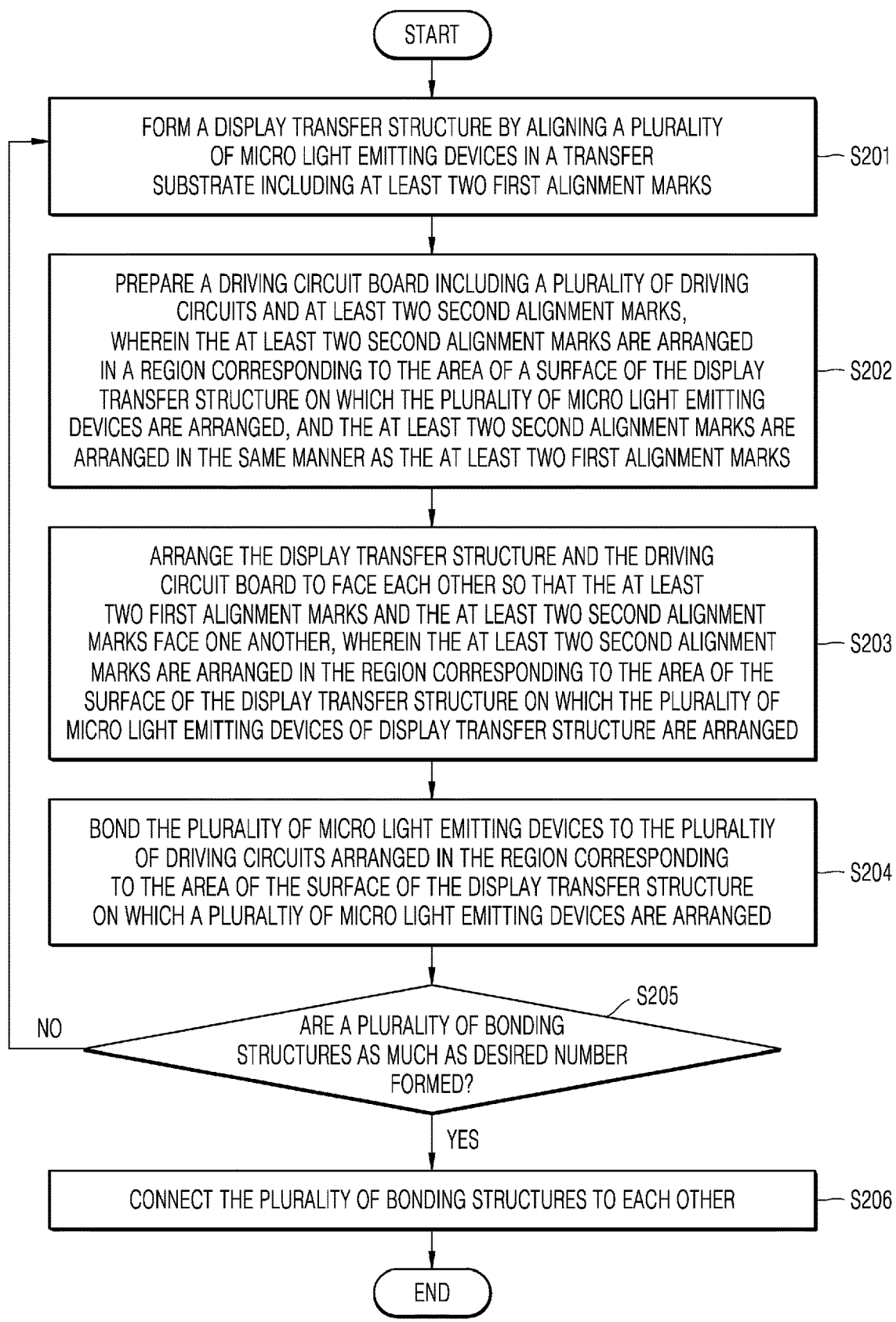
FIG. 9 is a flowchart schematically illustrating a method of manufacturing a micro light emitting device array according to another example embodiment.
Figure 10:
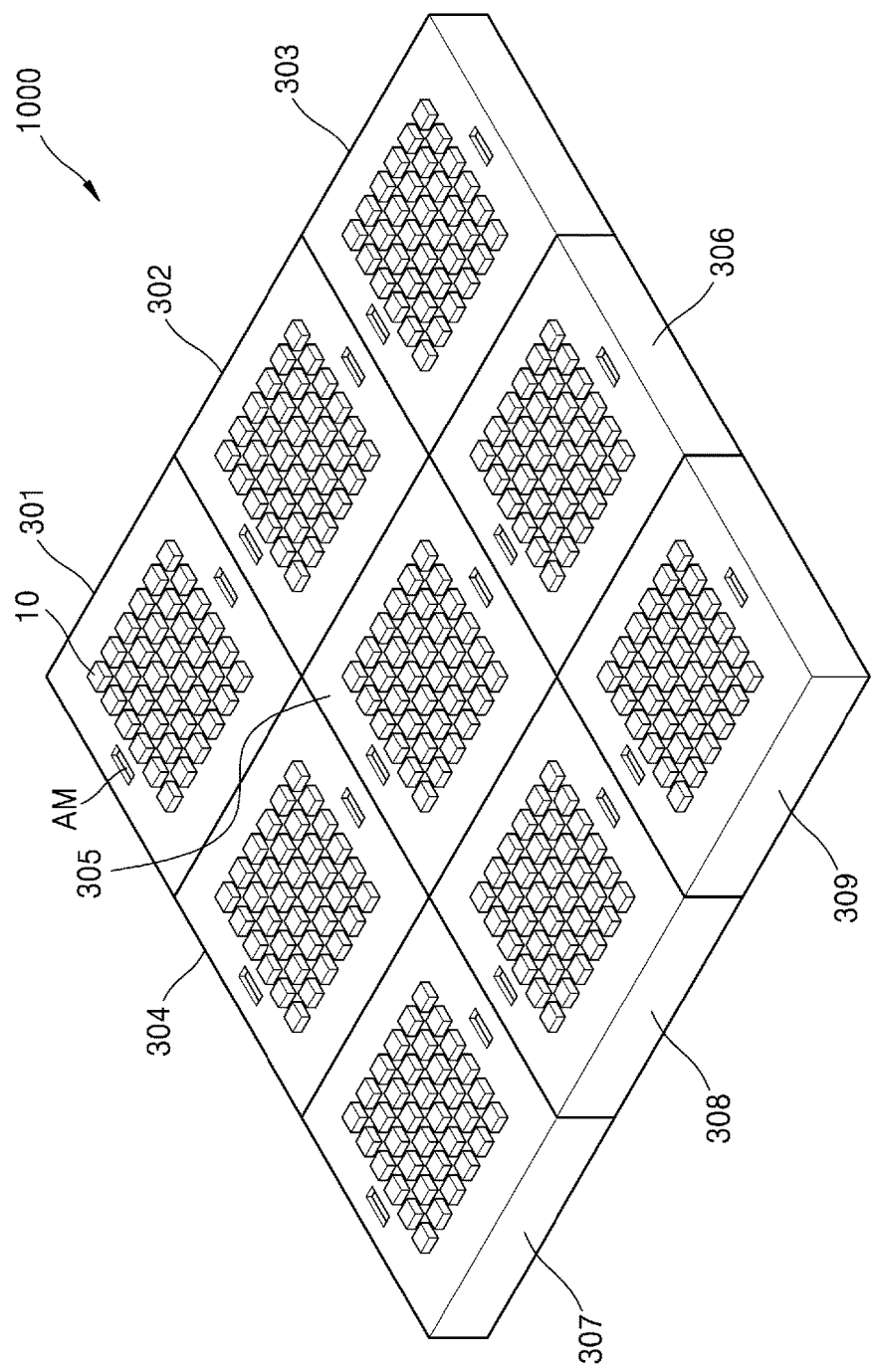
FIG. 10 is a perspective view schematically illustrating the configuration of a micro light emitting device array manufactured by the manufacturing method of FIG. 9 according to an example embodiment.

FIG. 9 is a flowchart schematically illustrating a method of manufacturing a micro light emitting device array according to another example embodiment. FIG. 10 is a perspective view schematically illustrating the configuration of a micro light emitting device array 1000 manufactured by the manufacturing method of FIG. 9.

First through fourth operations (S201 through S204) of the method of manufacturing the micro light emitting device array shown in FIG. 9 may be substantially the same as first through fourth steps (S101 through S104) shown in FIG. 1. The method of manufacturing the micro light emitting device array of FIG. 9 may further include a fifth operation S205 and a sixth operation S206 compared to the manufacturing method of FIG. 1. When describing FIG. 9, redundant descriptions with FIGS. 1 through 8 will be omitted.

Referring to FIGS. 9 and 10, in a fifth operation (S205), first through fourth operation (S201 through S204) may be repeatedly performed so that a plurality of bonding structures 301, 302, 303, 304, 305, 306, 307, 308, and 309 may be formed by bonding the driving circuit board 200 to the plurality of micro light emitting devices 10. Although nine bonding structures 301, 302, 303, 304, 305, 306, 307, 308 and 309 are shown in FIG. 10, this is for convenience of description, and example embodiments are not limited thereto.

In the sixth operation (S206), the plurality of bonding structures 301, 302, 303, 304, 305, 306, 307, 308 and 309 may be connected to one another so that a large-area micro light emitting device array 1000 may be formed. For example, the plurality of bonding structures 301, 302, 303, 304, 305, 306, 307, 308, and 309 may be connected to one another in a two-dimensional plane so that the large-area micro light emitting device array 1000 may be formed.

Also, for example, the length of each side of each of the plurality of bonding structures 301, 302, 303, 304, 305, 306, 307, 308, and 309 may be 8 inches to 10 inches. Also, the length of one side of the large-area micro light emitting device array 1000 may be 50 inches or more. However, this is just an example, and the length of each side of each the plurality of bonding structures 301, 302, 303, 304, 305, 306, 307, 308, and 309 and the length of the large-area micro light emitting device array 1000 are not limited to the above description.

According to the method of manufacturing the micro light emitting device array of FIG. 9, the plurality of bonding structures 301, 302, 303, 304, 305, 306, 307, 308, and 309 formed as many as desired using alignment marks AM may be connected to one another, so that the large-area micro light emitting device array 1000 shown in FIG. 10 may be more efficiently manufactured. Here, the large area may refer to an area greater than the area of the display transfer structure 100.

Figure 11:
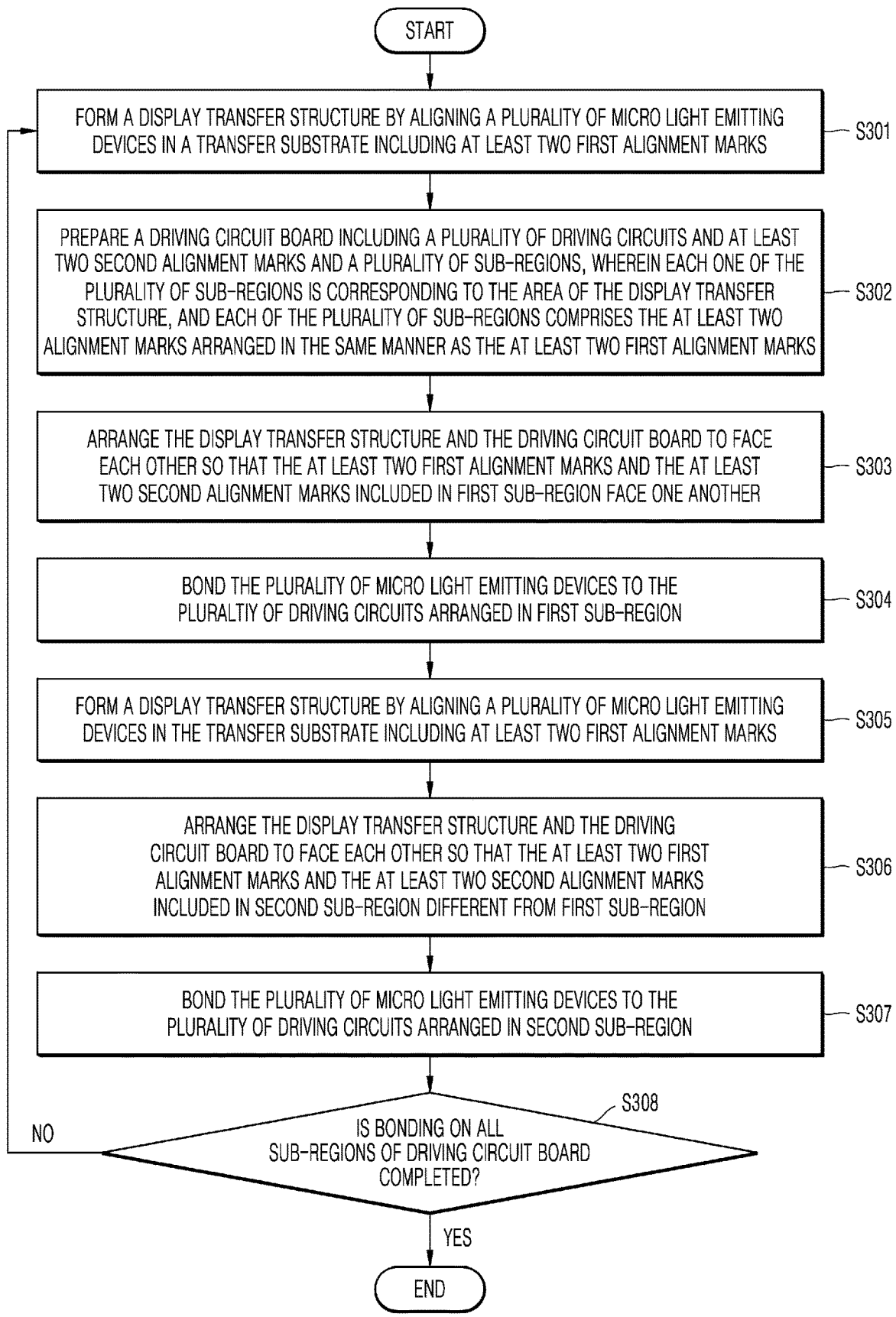
FIG. 11 is a flowchart schematically illustrating a method of manufacturing a micro light emitting device array according to another example embodiment.

FIG. 11 is a flowchart schematically illustrating a method of manufacturing a micro light emitting device array according to another example embodiment. FIGS. 12 through 16 are perspective views schematically illustrating a process of manufacturing the micro light emitting device array 1100 according to the manufacturing method of FIG. 12.

First through fourth operations (S301 through S304) of the method of manufacturing the micro light emitting device array shown in FIG. 11 may be substantially the same as the first through fourth operation (S101 through S104) shown in FIG. 1. However, the driving circuit board 210 prepared in the second operation S302 of the manufacturing method of FIG. 11 is different from the driving circuit board 200 prepared in the second operation S102 of the manufacturing method of FIG. 1. For example, referring to FIG. 12, the area of the upper surface of the driving circuit board 210 may be greater than the area of the upper surface of the display transfer structure 100 that faces the upper surface of the driving circuit board 210. For example, the driving circuit board 210 may include a plurality of sub-regions SA1, SA2, SA3, SA4, SA5, SA6, SA7, SA8, and SA9 corresponding to the area of the upper surface of the display transfer structure 100. The areas of the plurality of sub-regions SA1, SA2, SA3, SA4, SA5, SA6, SA7, SA8, and SA9 may be the same. At least two second alignment marks AM may be arranged in each of the plurality of sub-regions SA1, SA2, SA3, SA4, SA5, SA6, SA7, SA8, and SA9.

Although thirty-six micro light emitting devices 10 or driving circuits 20 are shown in each of the plurality of sub-regions SA1, SA2, SA3, SA4, SA5, SA6, SA7, SA8, and SA9 of FIGS. 12 through 16, this is for convenience of description. The number of the plurality of micro light emitting devices 10 and the number of driving circuits 20 are not limited thereto. For example, the number of a plurality of micro light emitting devices 10 or the number of driving circuits 20 that may be arranged in each of the plurality of sub-regions SA1, SA2, SA3, SA4, SA5, SA6, SA7, SA8, and SA9 may be innumerable.

Figure 12:
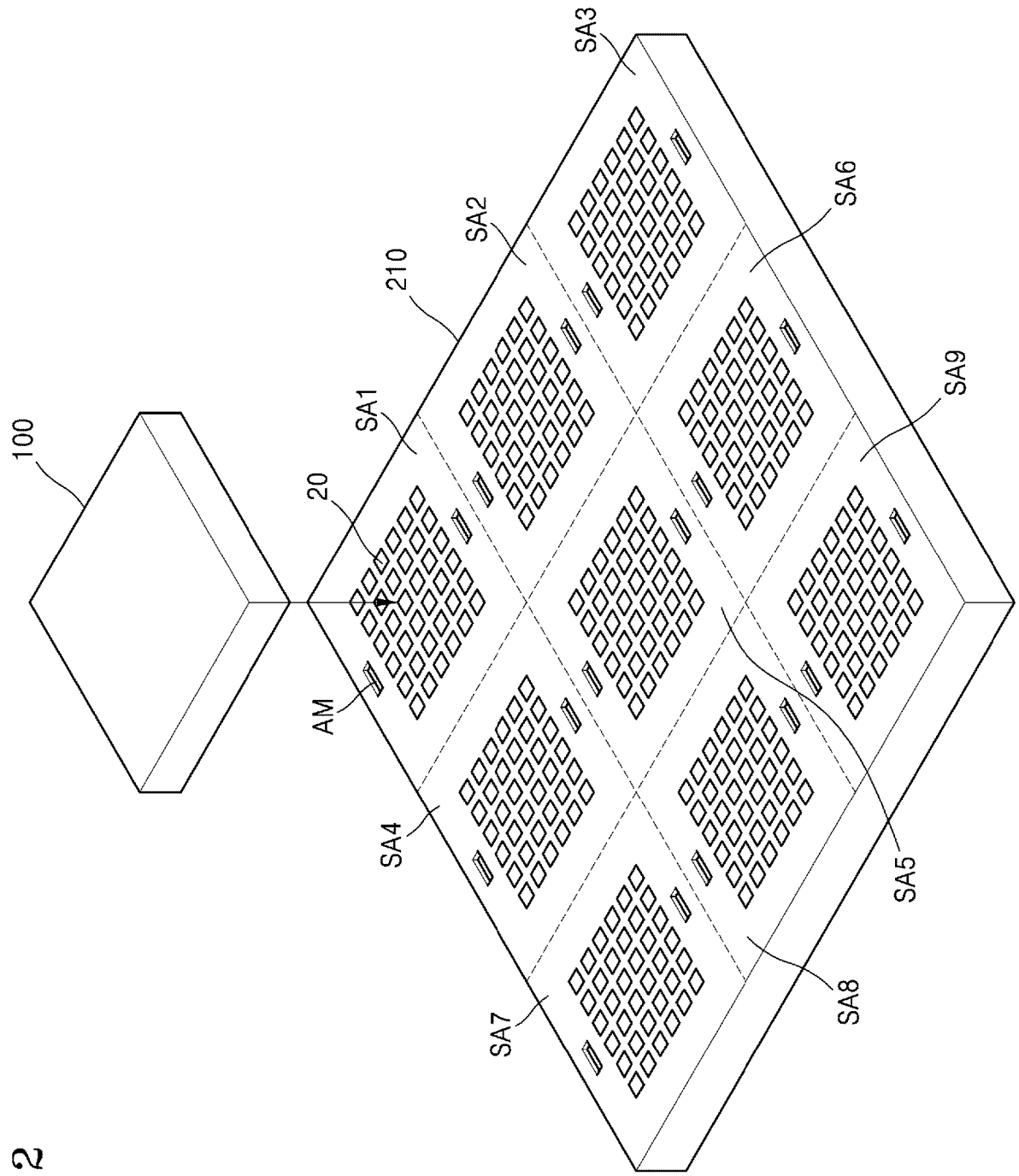
FIGS. 12 through 16 are perspective views schematically illustrating a process of manufacturing the micro light emitting device array according to the manufacturing method of FIG. 12 according to example embodiments.
Figure 13:
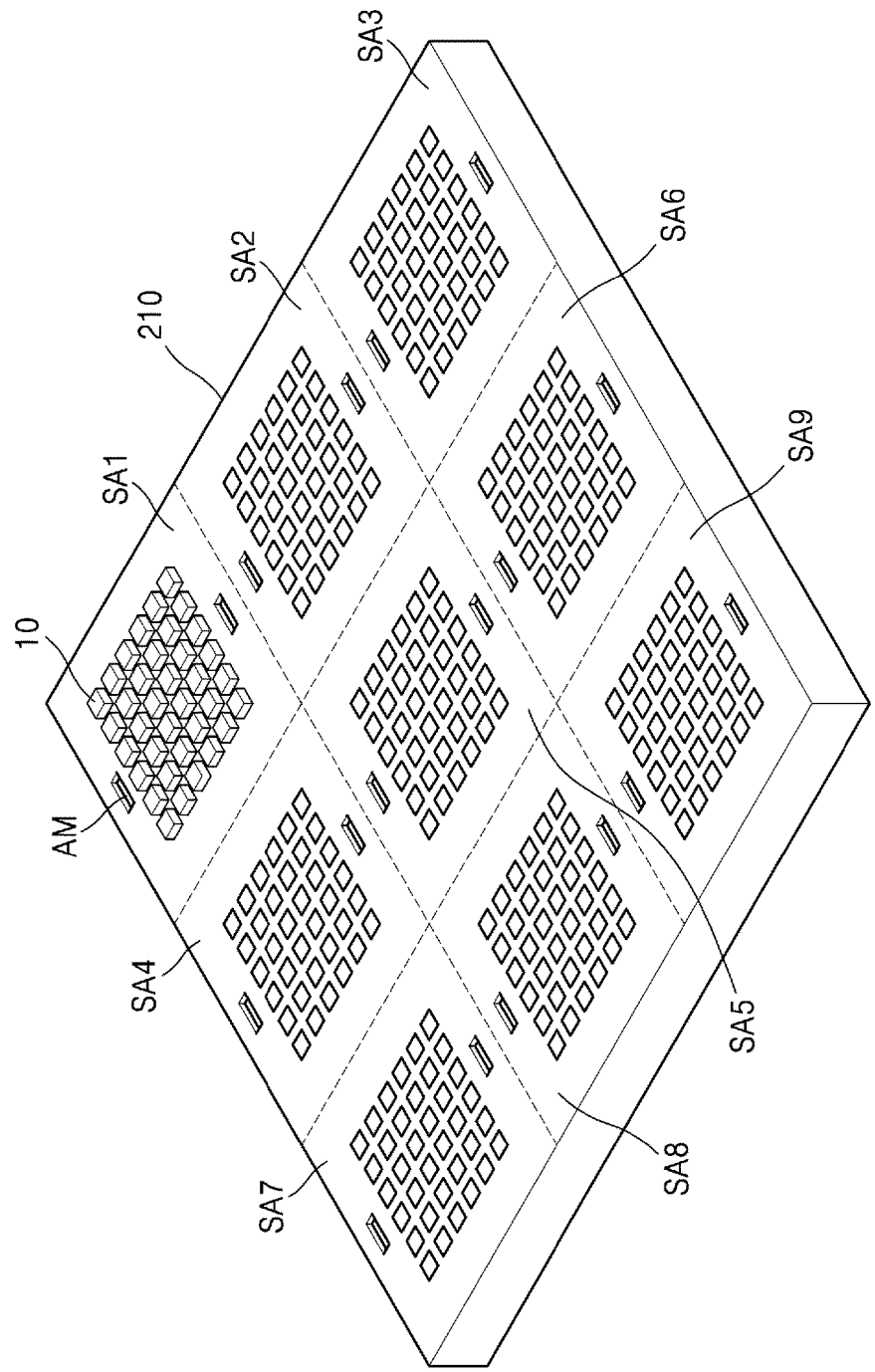

Referring to FIGS. 12 and 13, the first through fourth operations (S301 through S304) of FIG. 11 may be performed on a first sub-region SA1 from among the plurality of sub-regions SA1, SA2, SA3, SA4, SA5, SA6, SA7, SA8, and SA9 of the driving circuit board 210. Thus, a plurality of micro light emitting devices 10 may be bonded to the first sub-region SA1 of the driving circuit board 210.

Figure 14:
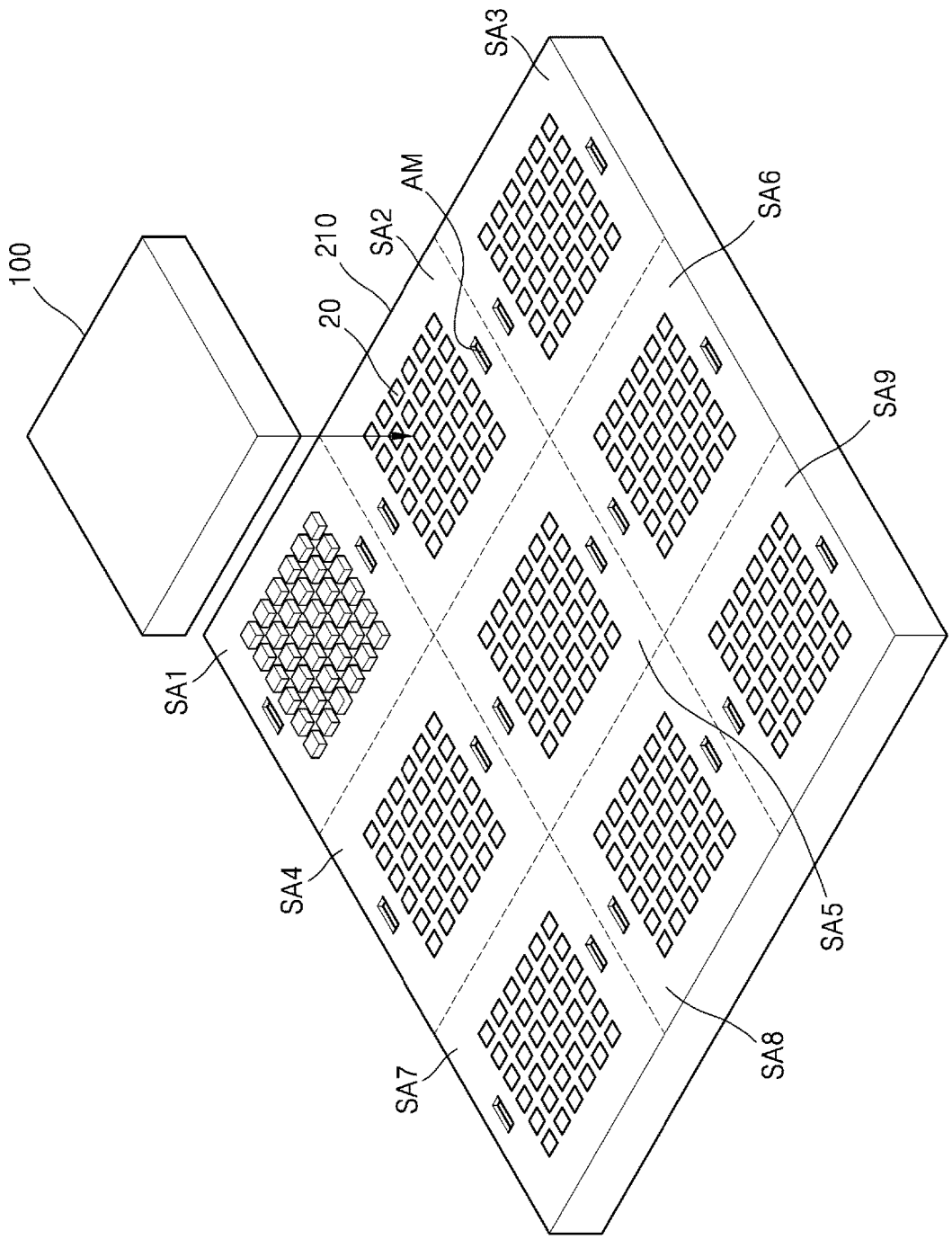
Figure 15:
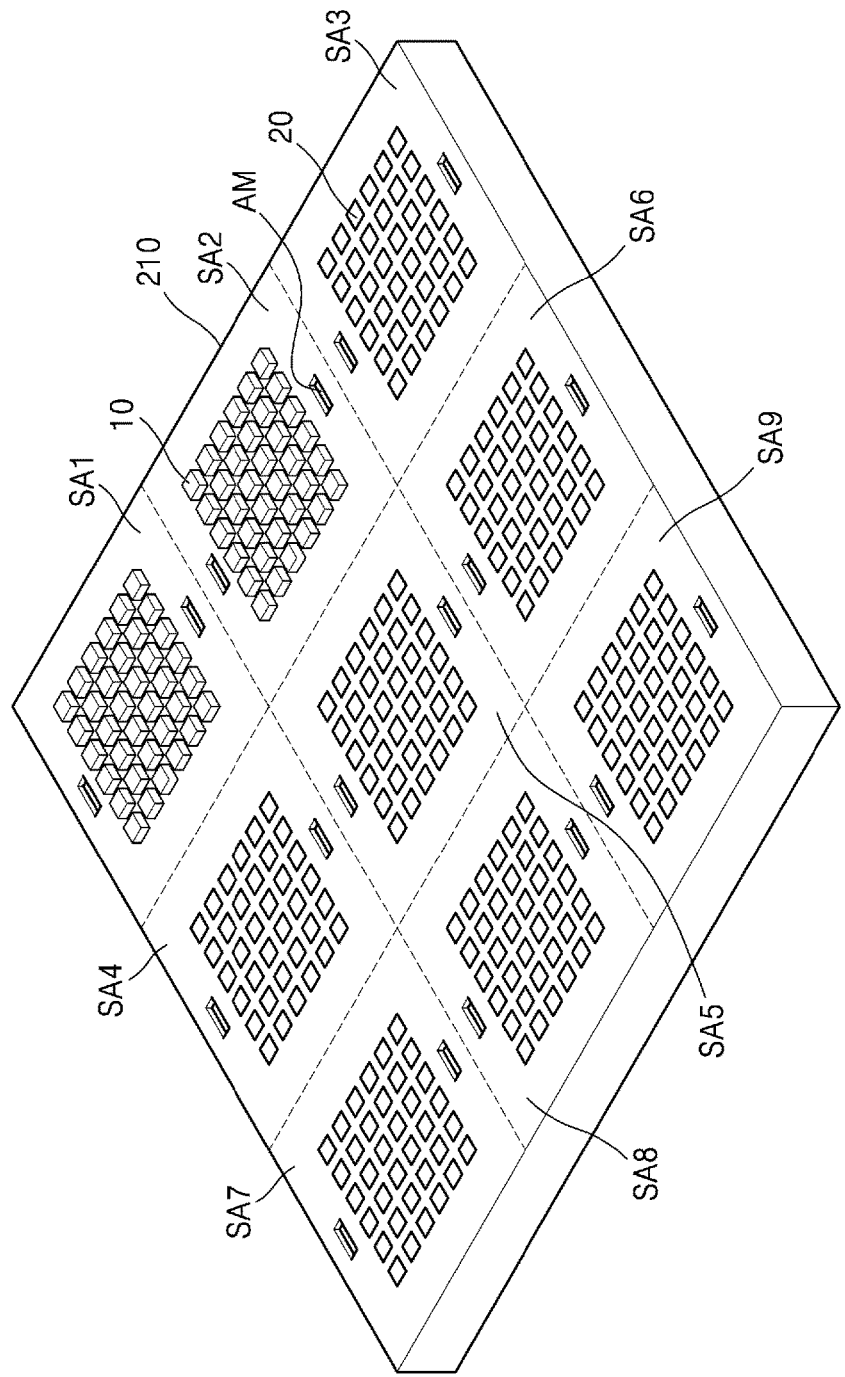

Also, the manufacturing method of FIG. 11 may further include fifth through eighth operations (S305 through S308) compared to the manufacturing method of FIG. 1. The fifth through seventh operations (S305 through S307) of FIG. 11 may be substantially the same as the first operation (S301), the third operation (S303), and the fourth operation (S304), respectively. However, the fifth operation (S305) through seventh operation (S307) may be performed on the second sub-region SA2 of the driving circuit board 210, unlike in the first operation (S301), the third operation (S303), and the fourth operation (S304). Thus, as shown in FIGS. 14 and 15, a plurality of micro light emitting devices 10 may be bonded to the second sub-region SA2 of the driving circuit board 210.

In the eighth operation (S308), it may be determined whether the micro light emitting device 10 is bonded to all of the plurality of sub-regions SA1, SA2, SA3, SA4, SA5, SA6, SA7, SA8, and SA9 of the driving circuit board 210. In the eighth operation (S308), when the micro light emitting device 10 is not bonded to all of the plurality of sub-regions SA1, SA2, SA3, SA4, SA5, SA6, SA7, SA8, and SA9 of the driving circuit board 210 (NO), the first through seventh operations (S301 through S307) may be repeatedly performed on a sub-region to which the micro light emitting device 10 is not bonded. In the eighth operation (S308), in case (YES) where the micro light emitting device 10 is bonded to all of the plurality of sub-regions SA1, SA2, SA3, SA4, SA5, SA6, SA7, SA8, and SA9 of the driving circuit board 210, procedures are ended.

Figure 16:
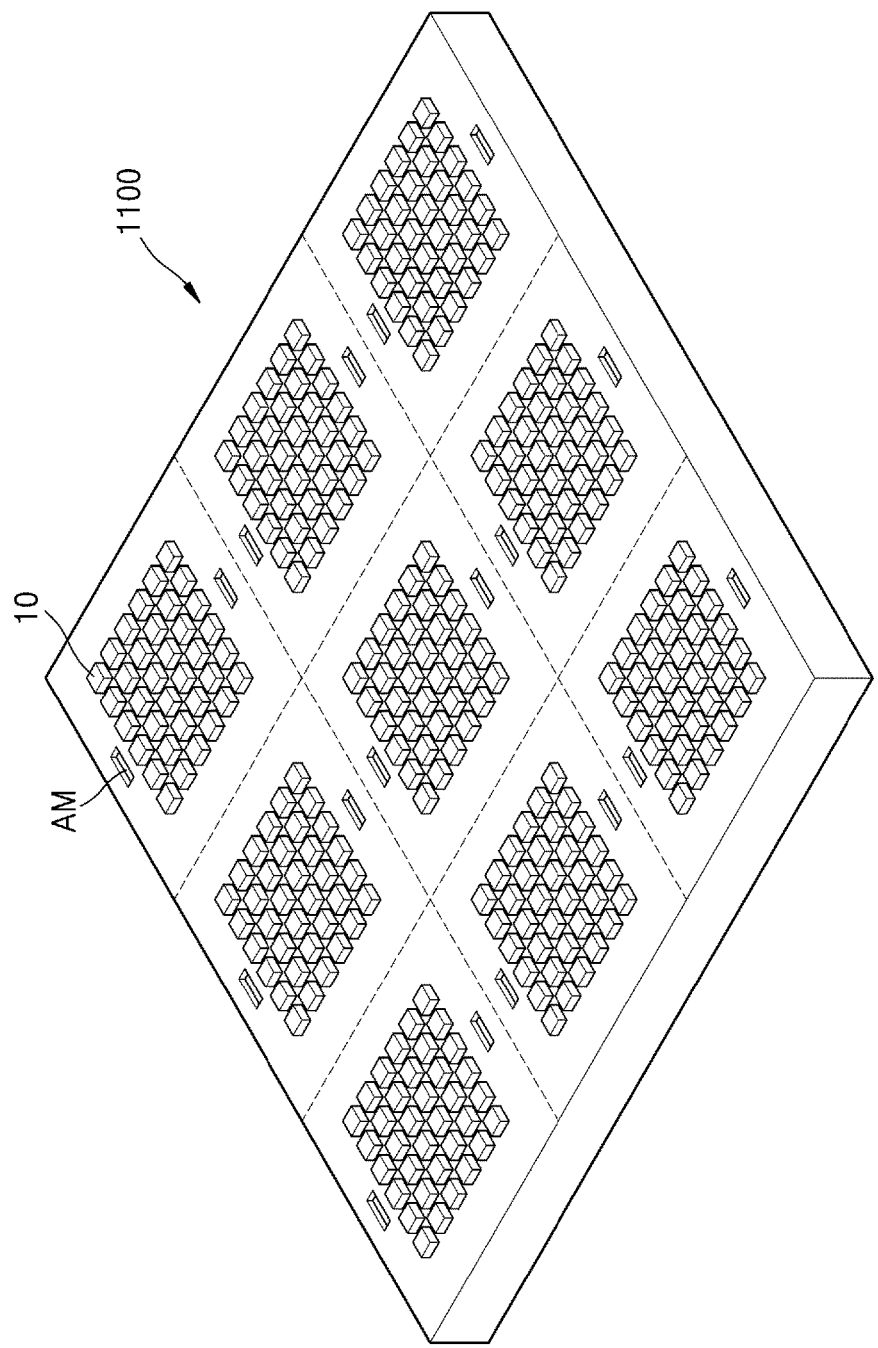

According to the method of manufacturing the micro light emitting device array of FIG. 11, a plurality of micro light emitting devices 10 are sequentially transferred to the plurality of sub-regions SA1, SA2, SA3, SA4, SA5, SA6, SA7, SA8, and SA9 of the large-area driving circuit board 210 including a plurality of second alignment marks AM, so that the large-area micro light emitting device array 1100 shown in FIG. 16 may be more efficiently manufactured. Here, the large area may refer to an area greater than the area of the display transfer structure 100.

Figure 17A:
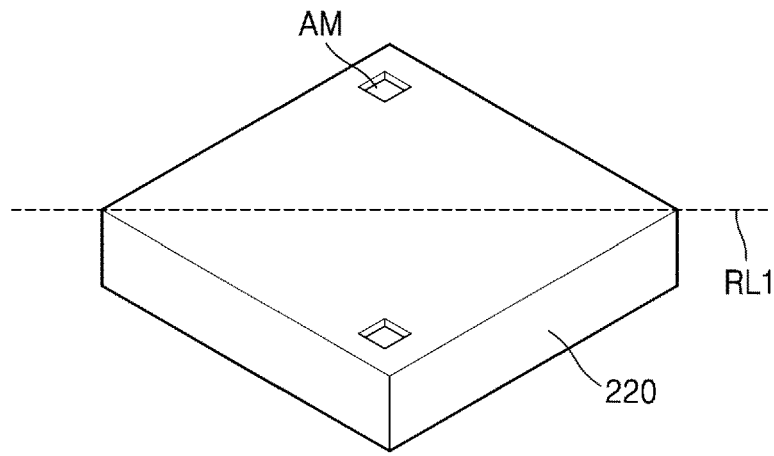
FIGS. 17A-17C schematically illustrate the configuration of example driving circuit boards according to an example embodiment.
Figure 17B:
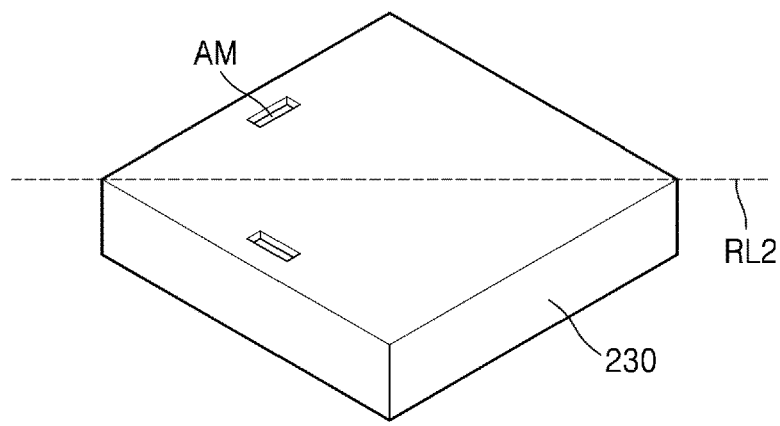
Figure 17C:
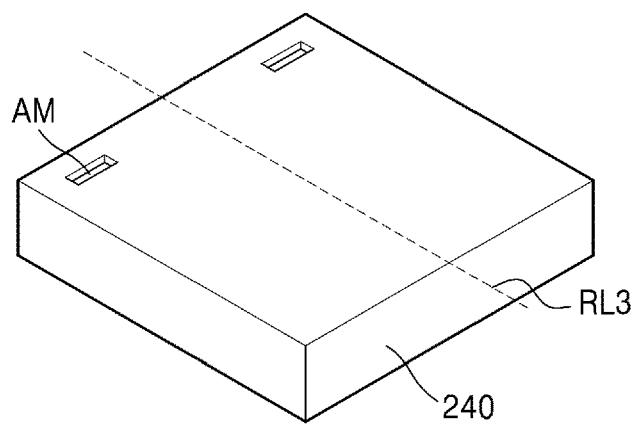

FIGS. 17A-17C schematically illustrate the configuration of example driving circuit boards 220, 230, and 240. In FIGS. 17A-17C, for convenience of description, a plurality of driving circuits included in the driving circuit boards 220, 230, and 240 have been omitted. The example driving circuit boards 220, 230, and 240 of FIGS. 17A-17C may be applied to example embodiments described with reference to FIGS. 1 through 16.

Referring to FIGS. 17A-17C, at least two alignment marks AM may be formed on the driving circuit boards 220, 230, and 240. At least two alignment marks AM may be formed on edges of the driving circuit boards 220, 230, and 240.

As shown in FIG. 17A, at least two alignment marks AM may be arranged on the example driving circuit board 220 at positions in which they are symmetrical to each other with respect to a diagonal center line RL1. For example, at least two alignment marks AM may be arranged in a corner regions facing each other with the diagonal center line RL1 disposed therebetween.

As shown in FIG. 17B, at least two alignment marks AM may be arranged on the example driving circuit board 230 at positions in which they are symmetrical to each other with respect to a diagonal center line RL2. For example, at least two alignment marks AM may be arranged in a region in which they are adjacent to two edges sharing a vertex through which the diagonal center line RL1 passes.

As shown in FIG. 17C, at least two alignment marks AM may be arranged on the example driving circuit board 240 at positions in which they are symmetrical to each other with respect to a center line RL3. For example, at least two alignment marks AM may be apart from each other based on the center line RL3 and may be arranged in a region adjacent to one arbitrary edge of the driving circuit board 240.

Figure 18:
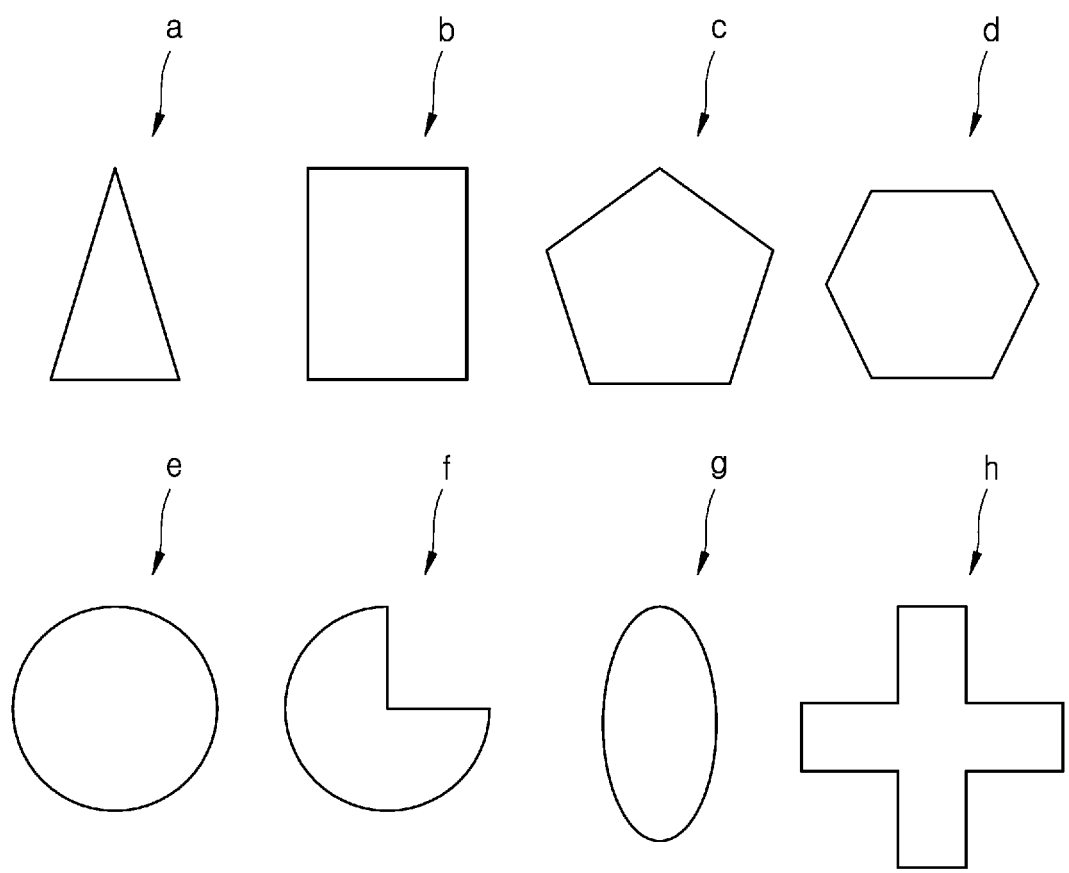
FIGS. 18 and 19 schematically illustrate example shapes of the surface of at least one first alignment marks and at least one second alignment marks that may be applied to the example embodiments described with reference to FIGS. 1 through 17 according to embodiments.
Figure 19:
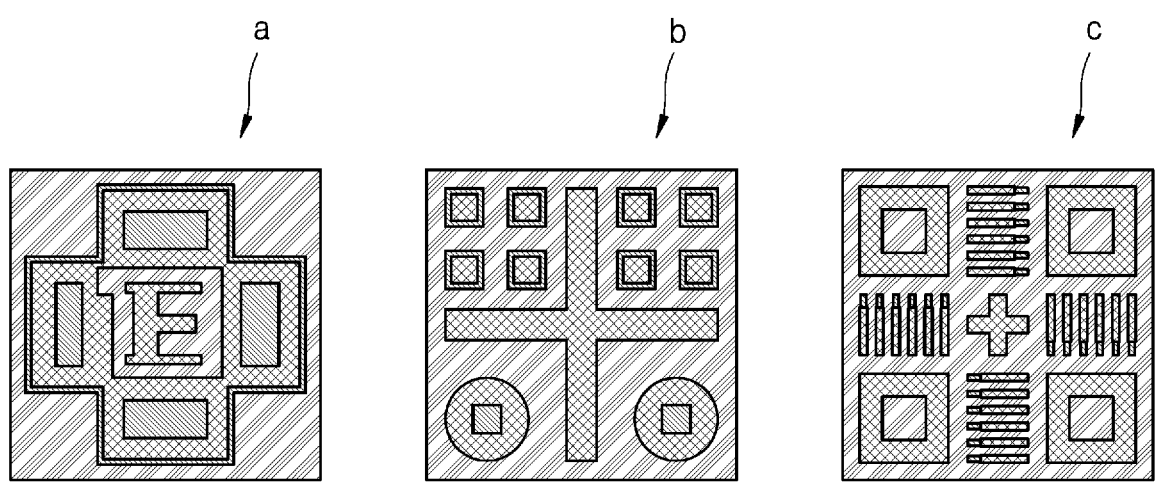

FIGS. 18 and 19 schematically illustrate example shapes of the surface of at least one first alignment marks AM1 and AM2 and at least one second alignment marks AM3 and AM4 that may be applied to the embodiments described with reference to FIGS. 1 through 17.

Surfaces of at least two first alignment marks AM1 and AM2 and at least two second alignment marks AM3 and AM4 that face each other may have at least one shape from among various figures, characters, numbers, or a combination thereof.

Referring to FIG. 18, surfaces of at least two first alignment marks AM1 and AM2 and at least two second alignment marks AM3 and AM4 that face each other may have various figure shapes. For example, as shown in FIG. 18, surfaces of at least two first alignment marks AM1 and AM2 and at least two second alignment marks AM3 and AM4 that face each other may have one shape from among a triangle (a), a rectangle (b), a square (b), a pentagon (c), hexagon (d), a circle (e), a partially erased circle (f), an ellipse (g), or a cross (h). However, embodiments are not limited thereto, and surfaces of at least two first alignment marks AM1 and AM2 and at least two second alignment marks AM3 and AM4 that face each other may include other shapes than various shapes shown in FIG. 18.

Referring to FIG. 19, surfaces of at least two first alignment marks AM1 and AM2 and at least two second alignment marks AM3 and AM4 that face each other may include various shapes, figures, or a combination thereof. The shapes shown in FIG. 19 are exemplary, and the shape of surfaces of at least two first alignment marks AM1 and AM2 and at least two second alignment marks AM3 and AM4 that face each other is not limited thereto.

Figure 20:
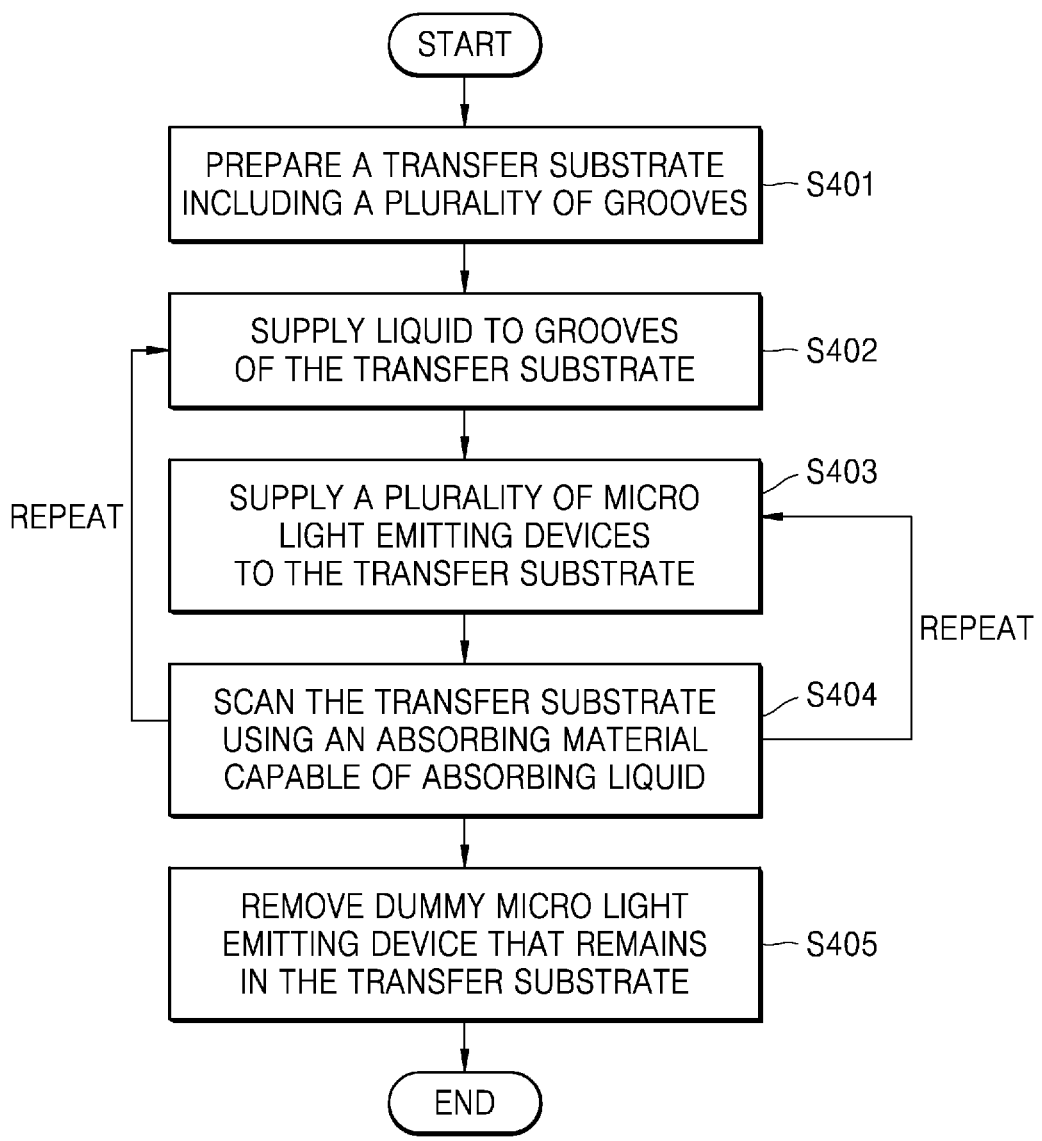
FIG. 20 is a flowchart schematically illustrating an example method of forming the display transfer structure in the first step of FIG. 1 according to an example embodiment.
Figure 21:
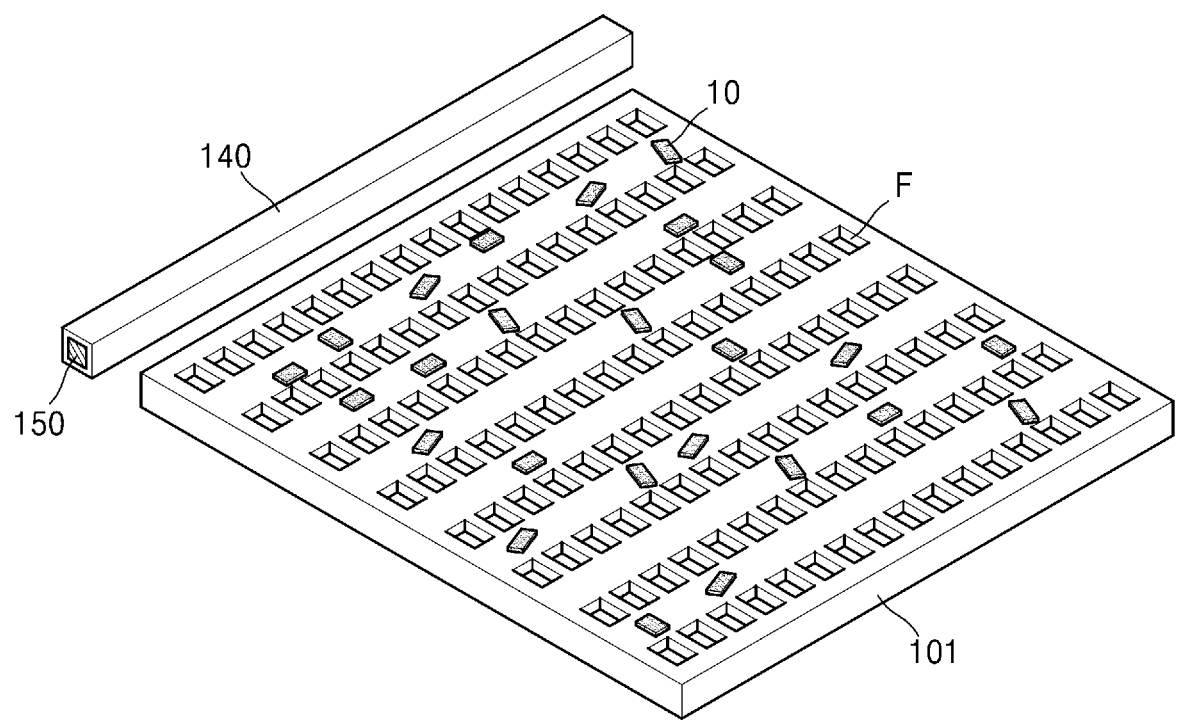
FIG. 21 schematically illustrates the configuration of a micro light emitting device wet alignment apparatus according to an example embodiment.
Figure 22:
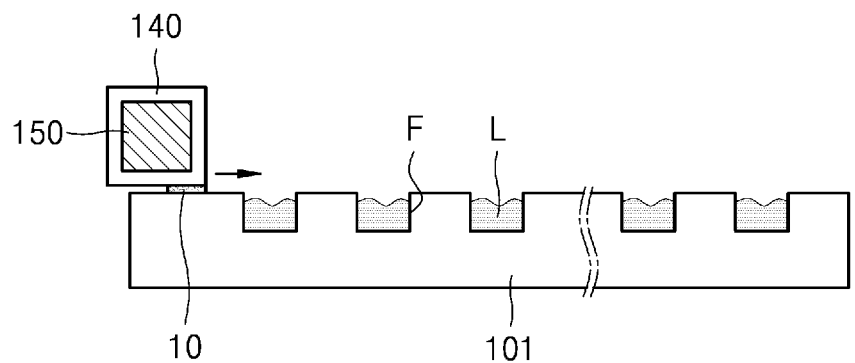
FIG. 22 illustrates a scanning process in a method of a micro light emitting device wet alignment method according to an example embodiment.
Figure 23:
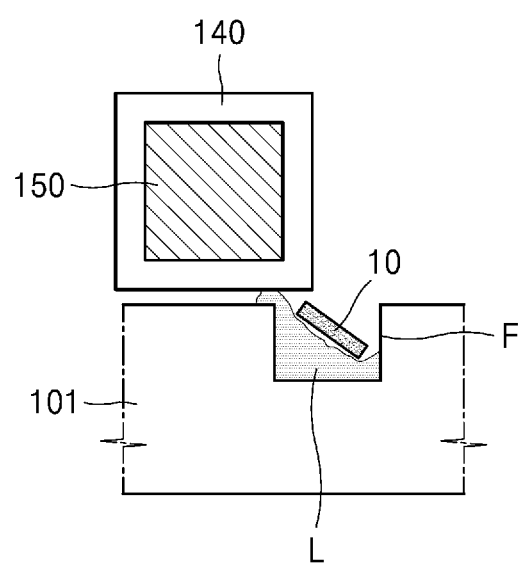
FIG. 23 illustrates a process of aligning a micro light emitting device according to the micro light emitting device wet alignment method according to an example embodiment.

FIG. 20 is a flowchart schematically illustrating an example method of forming the display transfer structure 100 of the first operation (S101) of FIG. 1. FIG. 21 schematically illustrates the configuration of a micro light emitting device wet alignment apparatus. FIG. 22 illustrates a scanning process of a method of a micro light emitting device wet alignment method according to an example embodiment. FIG. 23 illustrates a process of aligning a micro light emitting device according to the micro light emitting device wet alignment method according to an example embodiment.

The exemplary method of forming the display transfer structure 100 shown in FIG. 20 is a wet alignment method. The micro light emitting device wet alignment method according to an example embodiment will be described with reference to FIGS. 20 and 21.

A transfer substrate 101 including a plurality of grooves F may be prepared (S401). The transfer substrate 101 may be provided as a single layer or may include a plurality of layers. The plurality of grooves F may be provided to arrange at least one micro light emitting device 10. Liquid may be supplied to the plurality of grooves F (S402). The liquid may be any type of liquid as long as it does not corrode or damage the micro light emitting device 10. The liquid may include, for example, at least one of a group including water, ethanol, alcohol, polyol, ketone, halocarbon, acetone, flux, or organic solvent. The organic solvent may include isopropyl alcohol (IPA), for example. The liquid is not limited thereto, and there may be various modifications.

A method of supplying the liquid to the plurality of grooves F may be used in various ways, such as a spray method, a dispensing method, an inkjet dot method, and a method of flowing the liquid onto the transfer substrate 101. This will be described later.

A plurality of micro light emitting devices 10 may be supplied to the transfer substrate 101 (S403). The plurality of micro light emitting devices 10 may be directly sprayed onto the transfer substrate 101 without the liquid or may be supplied using a material other than the liquid. Alternatively, the micro light emitting devices 10 while being included in a solution may be supplied to the transfer substrate 101 in various ways. In this case, a method of supplying the micro light emitting devices 10 may be variously used in a spray method, a dispensing method, an inkjet dot method, and a method of flowing the solution onto the transfer substrate 101. A method of supplying the micro light emitting devices 10 to the transfer substrate 101 is not limited thereto and may be variously modified. The liquid may be supplied to fit the grooves F, or the liquid may be supplied to overflow from the grooves F. The amount of supply of the liquid may be variously adjusted.

The transfer substrate 101 may be scanned using an absorbing material 140 capable of absorbing the liquid (S404). The absorbing material 140 is sufficient as long as it is a material capable of absorbing the liquid, and the shape or structure thereof is not limited. The absorbing material 140 may include, for example, fabric, tissue, polyester fiber, paper, or wiper. The absorbing material 140 may be used alone without other auxiliary devices. However, example embodiments are not limited thereto, and the absorbing material 140 may be coupled to a support 150 to facilitate scanning of the transfer substrate 101 with the absorbing material 140. The support 150 may have various shapes and structures suitable for scanning the transfer substrate 101. The support 150 may include, for example, a rod, a blade, a plate, or wiper. The absorbing material 140 may be provided on either side of the support 150, or the absorbing material 140 may be wound around the support 150.

The transfer substrate 101 may be scanned while the absorbing material 140 presses the transfer substrate 101 with an appropriate pressure. Scanning may include allowing the absorbing material 140 to come into contact with the transfer substrate 101 and to pass through the plurality of grooves F. The liquid may be absorbed by the absorbing material 140 during scanning. Scanning may be performed in various ways including, for example, at least one of a sliding method, a rotating method, a translating motion method, a reciprocating motion method, a rolling method, a spinning method or a rubbing method of the absorbing material 140 and may include both a regular method and an irregular method. Alternatively, scanning may include at least one of a rotating motion, a translating motion, a rolling motion, or a spinning motion of the transfer substrate 101. Alternatively, scanning may also be performed by cooperation between the absorbent material 140 and the transfer substrate 101.

Scanning the transfer substrate 101 using the absorbing material 140 may include absorbing the liquid in the plurality of grooves F when the absorbing material 140 passes through the plurality of grooves F. When the transfer substrate 101 is scanned using the absorbing material 140, at least one micro light emitting device 10 may be attached to the absorbing material 140. The absorbing material 140 may come into contact with the transfer substrate 101 and may pass through the plurality of grooves F.

In FIG. 20, supplying the liquid to the grooves F of the transfer substrate 101 (S402) and supplying the plurality of light emitting devices 10 to the transfer substrate 101 (S403) may be sequentially performed as separate operations or may be performed in an opposite order. As such, the disclosure of the method is not limited to the order illustrated flowcharts of the disclosure. Also, supplying the liquid to the grooves F of the transfer substrate 101 (S402) and supplying the plurality of micro light emitting devices 10 to the transfer substrate 120 (S403) may be simultaneously performed as one step.

Next, after all of the micro light emitting devices 10 are transferred to the transfer substrate 101, a dummy micro light emitting device that remains in the transfer substrate 101 may be removed (S405).

Referring to FIG. 22, the absorbing material 140 may be provided on the surface of the support 150, and scanning may be performed in a state in which the absorbing material 140 comes into contact with the surface of the transfer substrate 101. When scanning is performed by the absorbing material 140, the micro light emitting devices 10 may be adsorbed onto or attached to the surface of the absorbing material 140, and the micro light emitting devices 10 may be pushed by the absorbing material 140 and may be moved forwards. The micro light emitting devices 10 may be arranged between the absorbing material 140 and the transfer substrate 101.

FIG. 23 is an enlarged view of the grooves F. The micro light emitting devices 10 moved by the absorbing material 140 may enter the grooves F. Here, the absorbing material 140 may absorb the liquid L in the grooves F, and the micro light emitting devices 10 may enter the grooves F.

Referring back to FIGS. 20 and 21, operations S402, S403, and S404 may be repeatedly performed as necessary until all of the plurality of micro light emitting devices 10 may be transferred to the grooves F of the transfer substrate 101. For example, after the transfer substrate 101 is scanned using the absorbing material 140, when the liquid is not present in the grooves F or is not sufficient, operation S402 of supplying the liquid to the grooves F may be further performed. Here, when the plurality of micro light emitting devices 101 are not sufficient in the transfer substrate 101, from operations S402, S403 and S404 may be performed without going through operation S403. Alternatively, when too much liquid is supplied to the transfer substrate 101, some liquid may be removed using a blade as needed.

Alternatively, after the transfer substrate 101 is scanned using the absorbing material 140, when the plurality of micro light emitting devices 10 are insufficient in the transfer substrate 101, supplying the plurality of micro light emitting devices 10 to the transfer substrate 101 may be further performed.

Through the above-described process, the plurality of micro light emitting devices 10 may be aligned on the transfer substrate 101.

Figure 24:
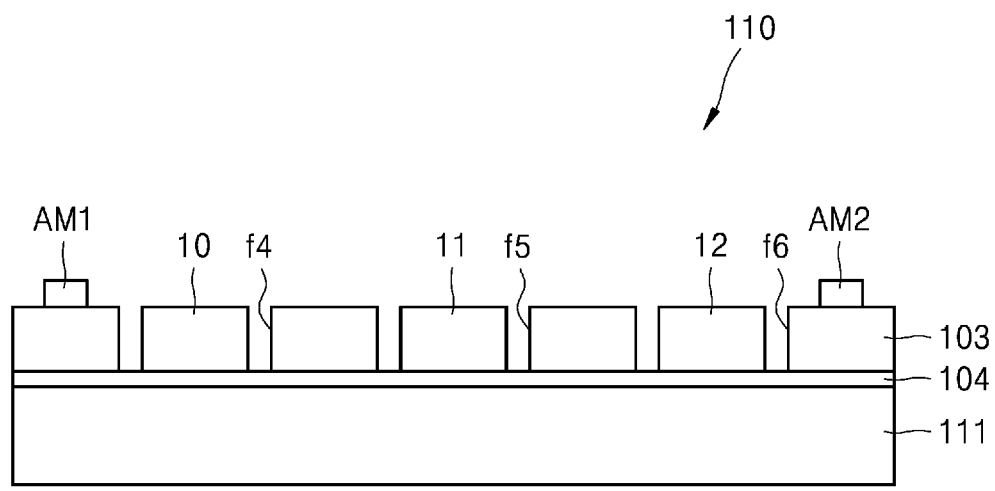
FIG. 24 schematically illustrates the configuration of a display transfer structure according to an example embodiment.

FIG. 24 schematically illustrates the configuration of a display transfer structure 110 according to another example embodiment.

Referring to FIG. 24, the display transfer structure 110 may include a substrate 111 and a transfer mold 103. A plurality of grooves f4, f5, and f6 may be provided in the transfer mold 103. The plurality of grooves f4, f5, and f6 may be provided in the transfer mold 103 in the form of through holes or grooves. Also, at least two alignment marks AM1 and AM2 may be formed on edges of the transfer mold 103.

Furthermore, an oxide layer 104 may be further provided between the substrate 111 and the transfer mold 103 of the display transfer structure 110. The oxide layer 104 may include, for example, $SiO_2$, $Al_2O_3$, or $NiO_2$. The oxide layer 104 may have hydrophilicity. The oxide layer 104 may facilitate the liquid to be filled in the plurality of grooves f4, f5, and f6.

Figure 25:
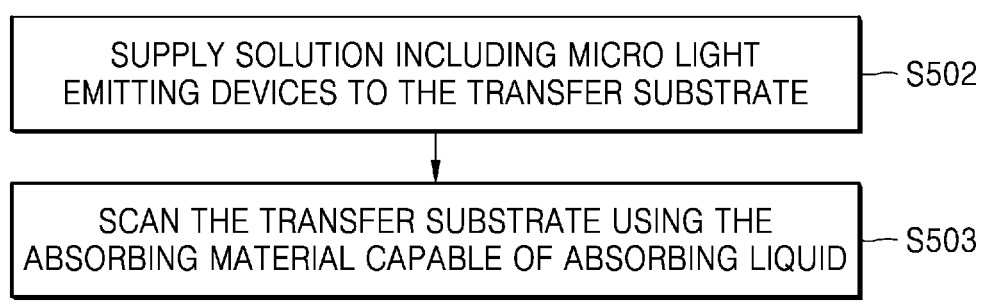
FIG. 25 illustrates a flowchart of a micro light emitting device wet alignment method according to an example embodiment.
Figure 26:
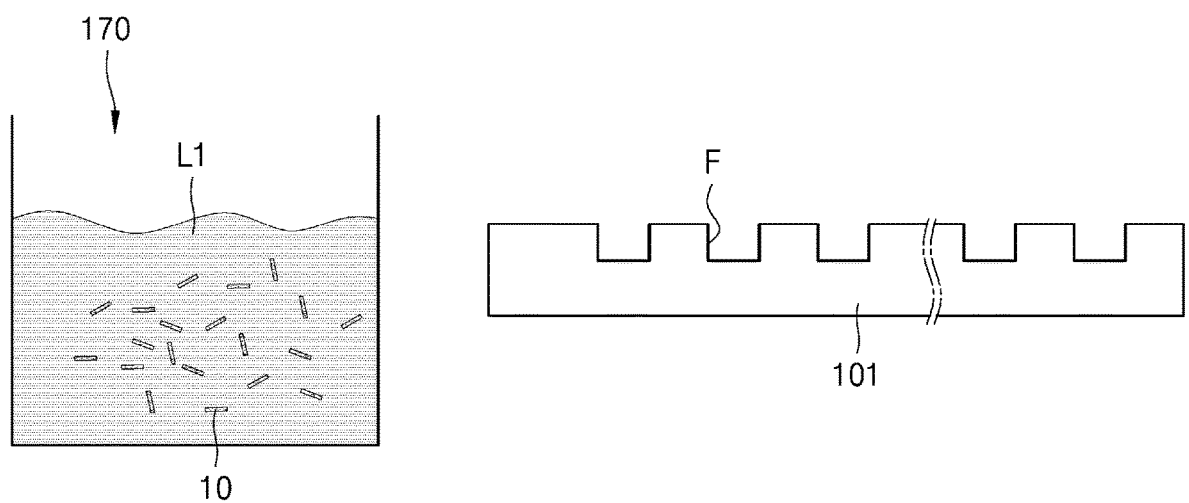
FIG. 26 illustrates a solution and a transfer substrate used in the micro light emitting device wet alignment method according to an example embodiment.
Figure 27:
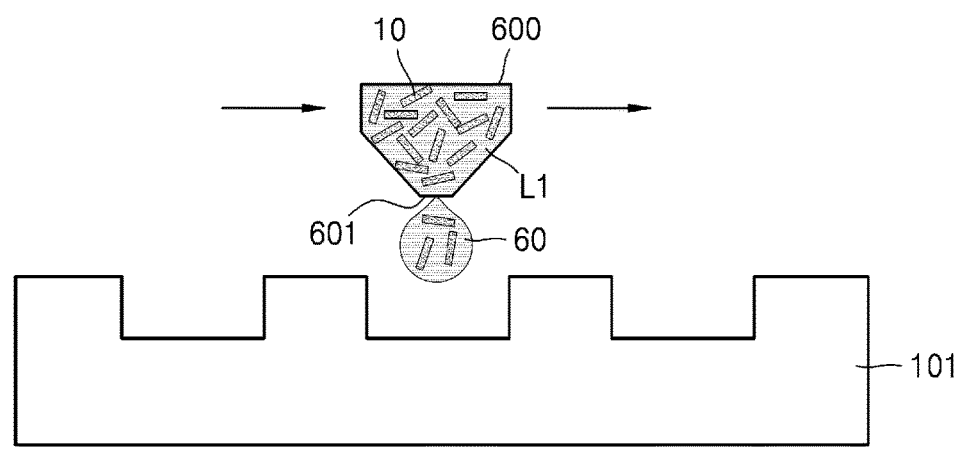
FIG. 27 illustrates an example method of supplying the solution including the micro light emitting devices of FIG. 25 to the transfer substrate according to an example embodiment.

FIG. 25 illustrates a micro light emitting device wet alignment method according to an example embodiment. FIG. 26 illustrates a solution 170 and a transfer substrate 101 used in the micro light emitting device wet alignment method according to an example. FIG. 27 illustrates an example method of supplying the solution 170 including the micro light emitting devices 10 of FIG. 25 to the transfer substrate 101.

Referring to FIG. 25, supplying the liquid L to the transfer substrate 101 shown in FIG. 20 (S402) and supplying the plurality of micro light emitting devices 10 to the transfer substrate 101 (S403) may be simultaneously performed.

Referring to FIGS. 25 and 26, the solution 170 including the plurality of micro light emitting devices 10 and a liquid L1 may be supplied to the transfer substrate 101 (S502). The solution 170 may be supplied to the transfer substrate 101 so that the liquid L1 may be supplied to the grooves F of the transfer substrate 101, and the plurality of micro light emitting devices 10 may be supplied to the transfer substrate 101. In this case, the liquid L1 does not need to be previously supplied to the grooves F of the transfer substrate 101 by a separate process. Supplying the liquid L1 to the grooves F of the transfer substrate 101 by a separate process may be optionally added.

Referring to FIG. 27, when the solution 170 is supplied to the transfer substrate 101, an inkjet method may be used. For example, the plurality of micro light emitting devices 10 may be supplied to the transfer substrate 101 by using an ink supply device 600 filled with the solution 170 including the liquid L1 and the plurality of micro light emitting devices 10 therein. While moving the ink supply device 600 on the transfer substrate 101 in parallel, liquid droplets 60 including the liquid L1 and the plurality of micro light emitting devices 10 may be discharged through an outlet 601. Thus, the plurality of micro light emitting devices 10 may be supplied to a desired position on the transfer substrate 101.

Figure 28:
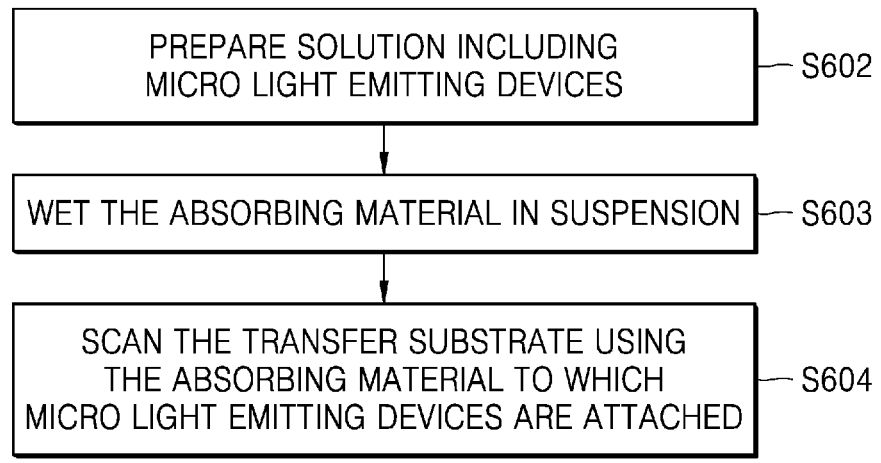
FIG. 28 illustrates a flowchart of a micro light emitting device wet alignment method according to an example embodiment.
Figure 29:
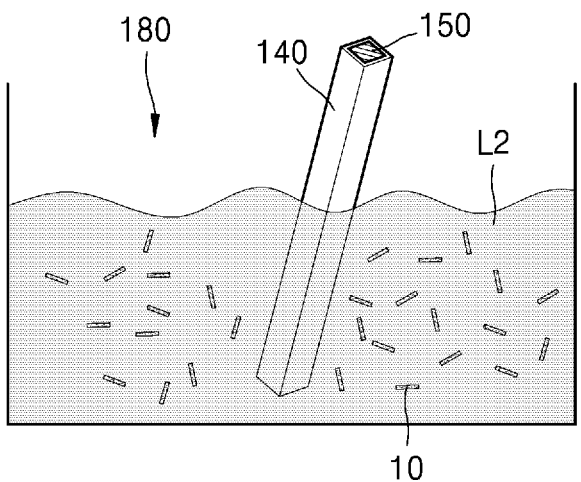
FIG. 29 illustrates a solution and an absorbing material used in a micro light emitting device wet alignment method according to an example embodiment.

FIG. 28 illustrates a micro light emitting device wet alignment method according to another example embodiment. FIG. 29 illustrates a solution and an absorbing material used in a micro light emitting device wet alignment method according to another example embodiment.

Referring to FIGS. 28 and 29, a solution 180 including a liquid L2 and micro light emitting devices 10 may be prepared (S602). An absorbing material 140 may be wetted in the solution 180 (S603). Here, the absorbing material 140 may be coupled to the support 150. However, the absorbing material 140 may be configured alone without the support 150. The absorbing material 140 may be wetted in the solution 180 so that the liquid L2 may be absorbed into the absorbing material 140 and the plurality of micro light emitting devices 10 may be attached to the absorbing material 140.

The transfer substrate (101 of FIG. 21) may be scanned using the absorbing material 140 to which the plurality of micro light emitting devices 10 are attached. When the transfer substrate 101 is scanned using the absorbing material 140, the liquid L2 may be supplied to the grooves F of the transfer substrate 101 from the absorbing material 140, and the plurality of micro light emitting devices 10 attached to the absorbing material 140 may be supplied to the transfer substrate 101. In other words, when the absorbing material 140 passes the transfer substrate 101, the plurality of micro light emitting devices 10 attached to the absorbing material 140 may be supplied to the transfer substrate 101, and the liquid L2 discharged from the absorbing material 140 may enter the grooves F on the front side. Also, when the absorbing material 140 passes through the grooves F, the liquid L2 in the grooves F may be re-absorbed into the absorbing material 140. While the liquid L2 is absorbed by the absorbing material 140, the micro light emitting devices 10 attached to the absorbing material 140 may enter the grooves F.

In the alignment method shown in FIG. 28, supplying the liquid L2 to the transfer substrate 101 and supplying the plurality of micro light emitting devices 10 may be simultaneously performed. Here, the term "simultaneous" may refer to temporal and simultaneous, or may include two steps performed together by a single process. In other words, when passing through the transfer substrate 101 while applying an appropriate pressure to the transfer substrate 101 with the absorbing material 140 to which the liquid L2 and the plurality of micro light emitting devices 10 are attached, the liquid may be supplied to the grooves F of the transfer substrate 101, and the plurality of micro light emitting devices 10 may be supplied to the transfer substrate 101. Here, supplying the plurality of micro light emitting devices 10 to the transfer substrate 101 may include allowing the plurality of micro light emitting devices 10 to come into contact with the transfer substrate 101.

Scanning the transfer substrate 101 using the absorbing material 140 (S604) may include at least one of rubbing the transfer substrate 101 with the absorbing material 140 and passing through the transfer substrate 101, rotating the absorbing material 140, rolling the absorbing material 140, translating the absorbing material 140, sliding the absorbing material 140, reciprocating the absorbing material 140, and spinning the absorbing material 140.

In the alignment method shown in FIG. 28, supplying a liquid to the grooves F of the transfer substrate 101 may not need to be separately provided. However, previously supplying a liquid to the grooves F of the transfer substrate 101 may be included. Alternatively, supplying the liquid to the grooves F of the transfer substrate 101 may be additionally performed as needed in the middle of repeatedly scanning the transfer substrate 101 with the absorbing material 140.

Figure 30:
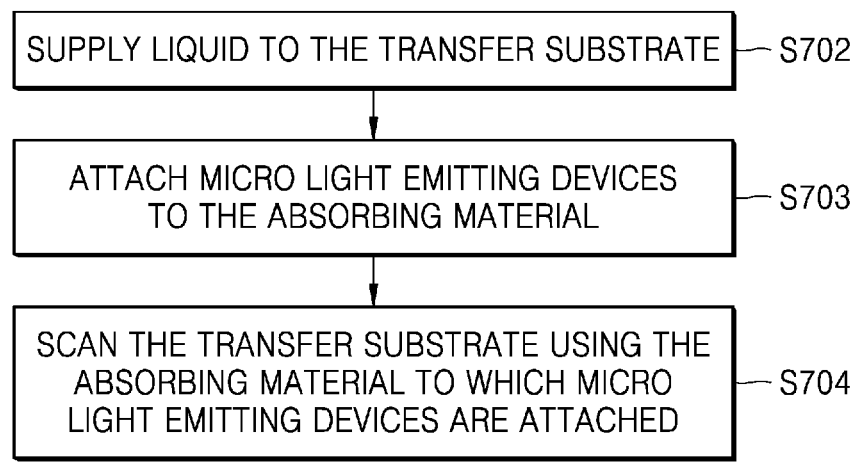
FIG. 30 illustrates a flowchart of a micro light emitting device wet alignment method according to an example embodiment.
Figure 31:
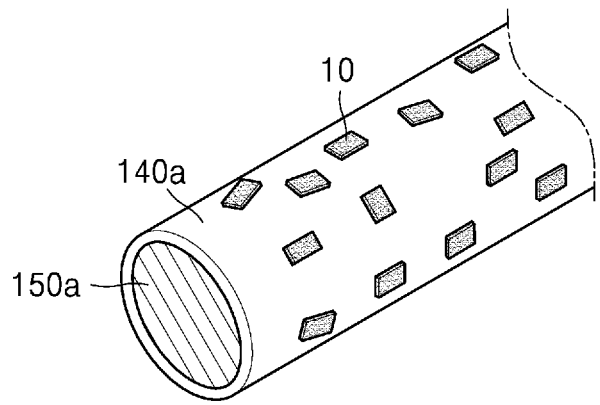
FIG. 31 illustrates an example of a state in which a plurality of micro light emitting devices are attached to an absorbing material used in a micro light emitting device wet alignment method according to an example embodiment.

FIG. 30 illustrates a micro light emitting device wet alignment method according to another example embodiment. FIG. 31 illustrates an example of a state in which a plurality of micro light emitting devices 10 are attached to an absorbing material 140a used in a micro light emitting device wet alignment method according to another example embodiment.

FIG. 30 illustrates a wet alignment method for a plurality of micro light emitting devices according to another example. Referring to FIGS. 30 and 31, a liquid may be supplied to a transfer substrate 101 (S702). Referring to FIG. 31, a plurality of micro light emitting devices 10 may be attached to the absorbing material 140a (S703). For example, when the plurality of micro light emitting devices 10 are rubbed using the absorbing material 140a or come into contact with each other by the absorbing material 140a, the plurality of micro light emitting devices 10 are very thin so that the plurality of micro light emitting devices 10 may be attached to the absorbing material 140a due to static electricity or the like. The transfer substrate 101 may be scanned using the absorbing material 140a to which the plurality of micro light emitting devices 10 are attached (S704).

When the transfer substrate 101 is scanned with the absorbing material 140a to which the plurality of micro light emitting devices 10 are attached, the plurality of micro light emitting devices 10 may be supplied to the transfer substrate 101. Also, when the transfer substrate 101 is scanned with the absorbing material 140a, the absorbing material 140a may absorb the liquid in the grooves F, and the plurality of micro light emitting devices 10 may enter the grooves F. According to an example embodiment, the absorbing material 140a may be coupled to a support 150a to facilitate scanning of the transfer substrate 101 with the absorbing material 140. Moreover, the absorbing material 140a may be rolled by the support 150a across the transfer substrate 101 to supply the plurality of micro light emitting devices 10.

In the example embodiment, after the liquid is absorbed by the absorbing material 140a, the plurality of micro light emitting devices 10 may be attached to the absorbing material 140a.

Figure 32:
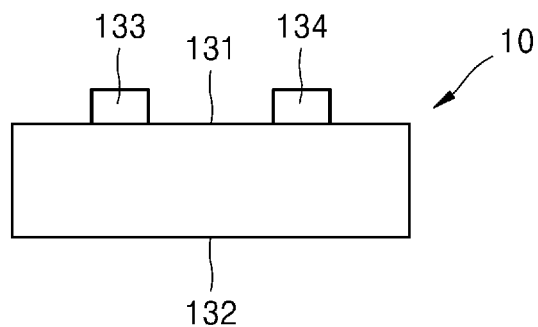
FIG. 32 schematically illustrates a micro light emitting device having a horizontal electrode structure according to an example embodiment.
Figure 33:
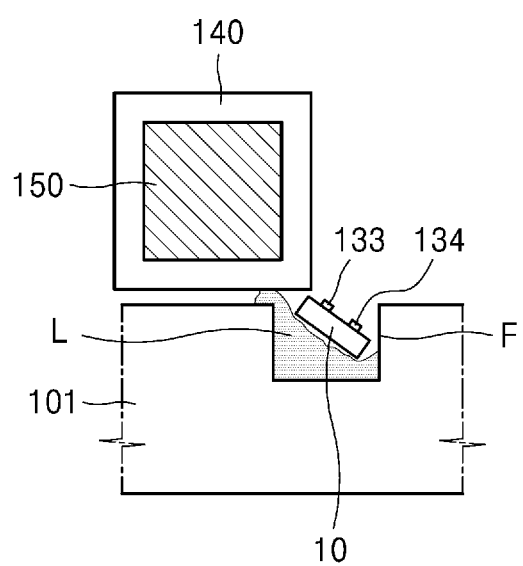
FIGS. 33 and 34 illustrate a process of aligning the micro light emitting devices having the horizontal electrode structure according to an example embodiment.
Figure 34:
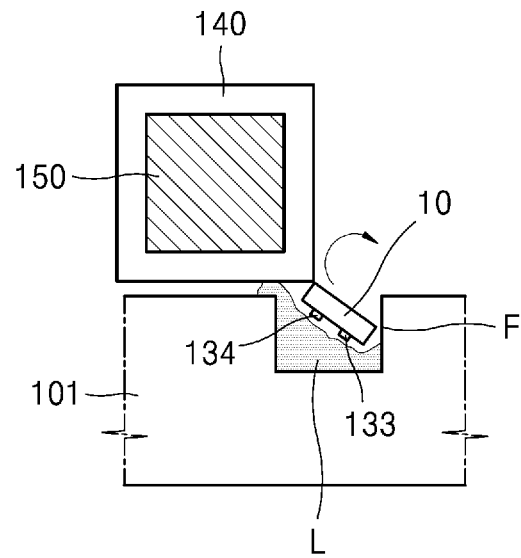

FIG. 32 schematically illustrates a micro light emitting device 10 having a horizontal electrode structure. FIGS. 33 and 34 illustrate a process of aligning the micro light emitting devices 10 having the horizontal electrode structure.

Referring to FIG. 32, each of the micro light emitting device 10 may include at least one electrode on one surface thereof. The micro light emitting device 10 may include, for example, a first surface 131 and a second surface 132. At least one first electrode 133 and at least one second electrode 134 may be included in the first surface 131. The first and second electrodes 133 and 134 may include at least one of a group consisting of aluminum (Al), gold (Au), platinum (Pt), molybdenum (Mo), copper (Cu), gold (Ag), and zinc (Zn). However, the type of electrode is not limited thereto. At least one first electrode 133 may be a positive electrode, and at least one second electrode 134 may be a negative electrode. The micro light emitting device 10 may have a horizontal electrode structure in which a negative electrode and a positive electrode are provided on one surface of the micro light emitting device 10.

FIG. 33 illustrates an operation of transferring the micro light emitting device 10 having the horizontal electrode structure to the transfer substrate 101.

Referring to FIG. 33, the liquid L may be absorbed by a scanning operation of the absorbing material 140, and the micro light emitting device 10 may be moved and placed on the grooves F. Here, the micro light emitting devices 10 may be arranged in such a way that the first and second electrodes 133 and 134 may face the upper opening of the grooves F. The first and second electrodes 133 and 134 may have hydrophobicity. In the scanning operation, the first and second electrodes 133 and 134 may be arranged to face the upper electrode of the grooves F using an interaction between the first and second electrodes 133 and 134 and the liquid L. When the micro light emitting device 10 is placed on the grooves F, the micro light emitting devices 10 may be submerged in the liquid L.

Referring to FIG. 34, the micro light emitting devices 10 are arranged in such a way that, when the first and second electrodes 133 and 134 are arranged to face the lower bottom of the grooves F, the liquid L may be absorbed by the scanning operation of the absorbing material 140 and the micro light emitting devices 10 may be moved to the grooves F and arranged according to the flow of the liquid L so that the first and second electrodes 133 and 134 may face the upper opening of the grooves F. In the drawings, the micro light emitting devices 10 float on the liquid L. However, embodiments are not limited thereto, and the micro light emitting devices 10 may be submerged in the liquid L.

Figure 35:
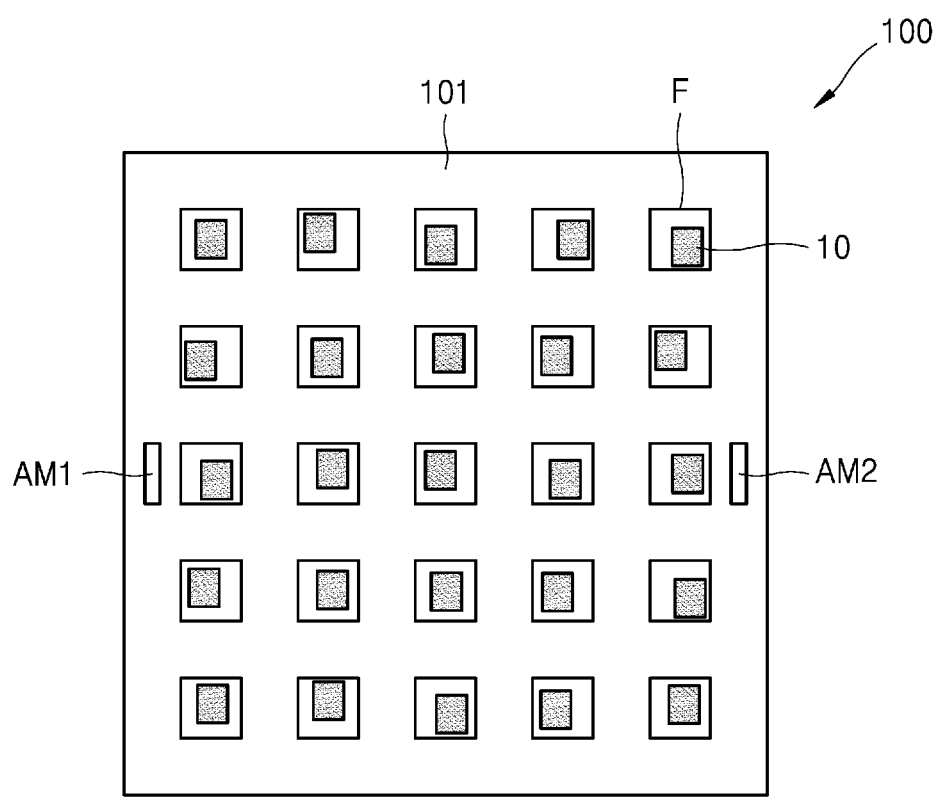
FIG. 35 is a plan view of a display transfer structure 100 according to an example embodiment.

FIG. 35 is a plan view of a display transfer structure 100 according to an example embodiment.

Referring to FIG. 35, a plurality of micro light emitting devices 10 may be arranged on the transfer substrate 101.

According to the micro light emitting device wet alignment method according to various example embodiments described with reference to FIGS. 20 through 34, the plurality of micro light emitting devices 10 may be irregularly and randomly arranged on the grooves F of the transfer substrate 101. According to an existing stamping method, positions in which the plurality of micro light emitting devices 10 are arranged in the grooves F of the transfer substrate 101, may be regular, whereas, in the micro light emitting device wet alignment method according to an example embodiment, positions in which the plurality of micro light emitting devices 10 are arranged in the grooves F of the transfer substrate 101, may be irregular.

Also, after transferring the plurality of micro light emitting devices 10 is completed and a dummy micro light emitting device is removed, by scanning the transfer substrate 101 with a clean absorbing material (140 of FIG. 34) at least once or more, the irregularity of the plurality of micro light emitting devices 10 irregularly arranged may be reduced.

Figure 36:
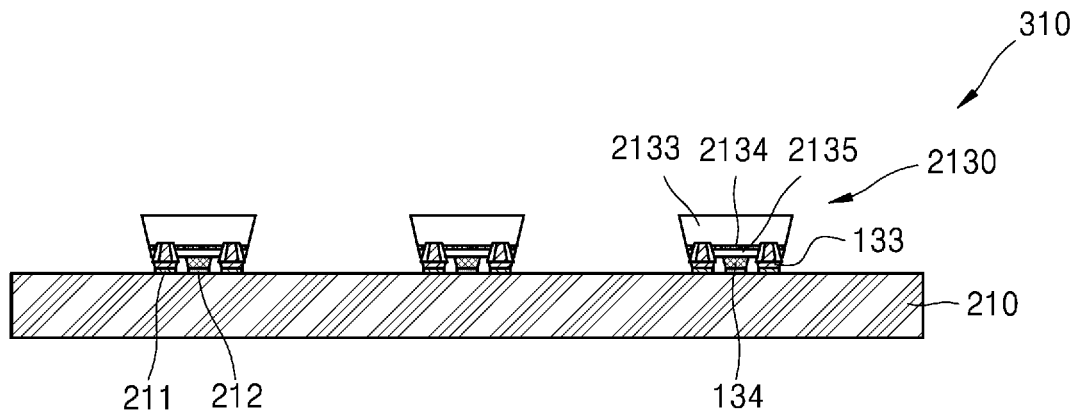
FIG. 36 schematically illustrates the configuration of a bonding structure 310 according to another example embodiment.

FIG. 36 schematically illustrates the configuration of a bonding structure 310 according to another example embodiment.

Referring to FIG. 36, the bonding structure 310 may include a driving circuit board 210. The plurality of micro light emitting devices 2130 aligned on the transfer substrate 101 shown in FIG. 35 may be transferred to the driving circuit board 210 and bonded to each other. In this case, the plurality of micro light emitting devices 2130 may include, for example, an n-type semiconductor layer 2133, an active layer 2134, and a p-type semiconductor layer 2135. The n-type semiconductor layer 2133 may be, for example, an n-type GaN layer, and the p-type semiconductor layer 2135 may be a p-type GaN layer. The active layer 2134 may have, for example, a quantum well structure or multi-quantum well structure. However, the plurality of micro light emitting devices 2130 are not limited thereto.

Also, at least one first electrode 133 and at least one second electrode 134 may be arranged in parallel on one surface of the plurality of micro light emitting devices 2130. A first driving circuit 211 and a second driving circuit 212 may be provided on the driving circuit board 210. When the plurality of micro light emitting devices 2130 are transferred to the driving circuit board 210, the first electrode 133 provided on one surface of the plurality of micro light emitting devices 2130 may be connected to the first driving circuit 211, and the second electrode 134 may be connected to the second driving circuit 212. The driving circuit board 210 may include, for example, at least one transistor and at least one capacitor.

Figure 37:
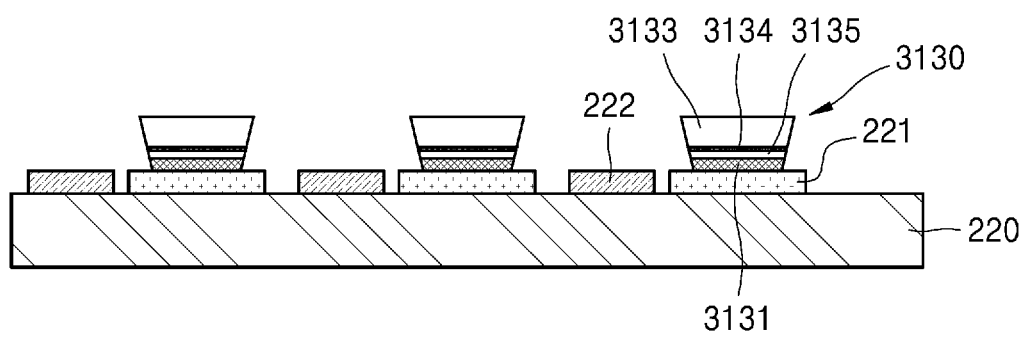
FIGS. 37 and 38 schematically illustrate the configuration of a bonding structure 320 according to another example embodiment.
Figure 38:
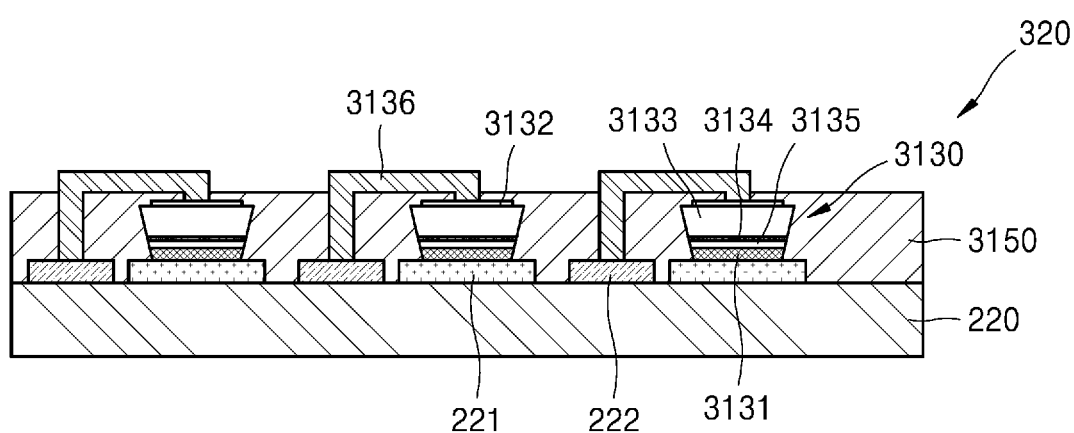

FIGS. 37 and 38 schematically illustrate the configuration of a bonding structure 320 according to another example embodiment.

Referring to FIG. 37, a plurality of micro light emitting devices 3130 aligned on the transfer substrate 101 shown in FIG. 35 may be transferred to the driving circuit board 220. The plurality of micro light emitting devices 3130 may include, for example, an n-type semiconductor layer 3133, an active layer 3134, and a p-type semiconductor layer 3135. The n-type semiconductor layer 3133 may be, for example, an n-type GaN layer, and the p-type semiconductor layer 3135 may be a p-type GaN layer. The active layer 3134 may have, for example, a quantum well structure or multi-quantum well structure. However, the plurality of micro light emitting devices 3130 are not limited thereto.

However, a first electrode 3131 may be arranged on one surface of the plurality of micro light emitting devices 3130. For example, the first electrode 3131 may be arranged on the p-type semiconductor layer 3135. A first driving circuit 221 and a second driving circuit 222 may be provided on the driving circuit board 220. When the plurality of micro light emitting devices 3130 are transferred to the driving circuit board 220, the first electrode 3131 may be connected to a first circuit 3210.

Referring to FIG. 38, an insulating layer 3150 may be further provided on a structure shown in FIG. 37. The insulating layer 3150 may be patterned so that a second electrode 3132 may be formed on the plurality of micro light emitting devices 3130. Also, the second electrode 3132 and the second driving circuit 222 may be connected to each other. For example, the second electrode 3132 and the second driving circuit 222 may be electrically connected to each other using a conductive connection portion 3136.

Also, in the display transfer structure 100 according to an example embodiment, one groove may be provided in a region of the transfer substrate 101 corresponding to one pixel, or a plurality of grooves may be provided in a region of the transfer substrate 101 corresponding to one pixel.

Figure 39:
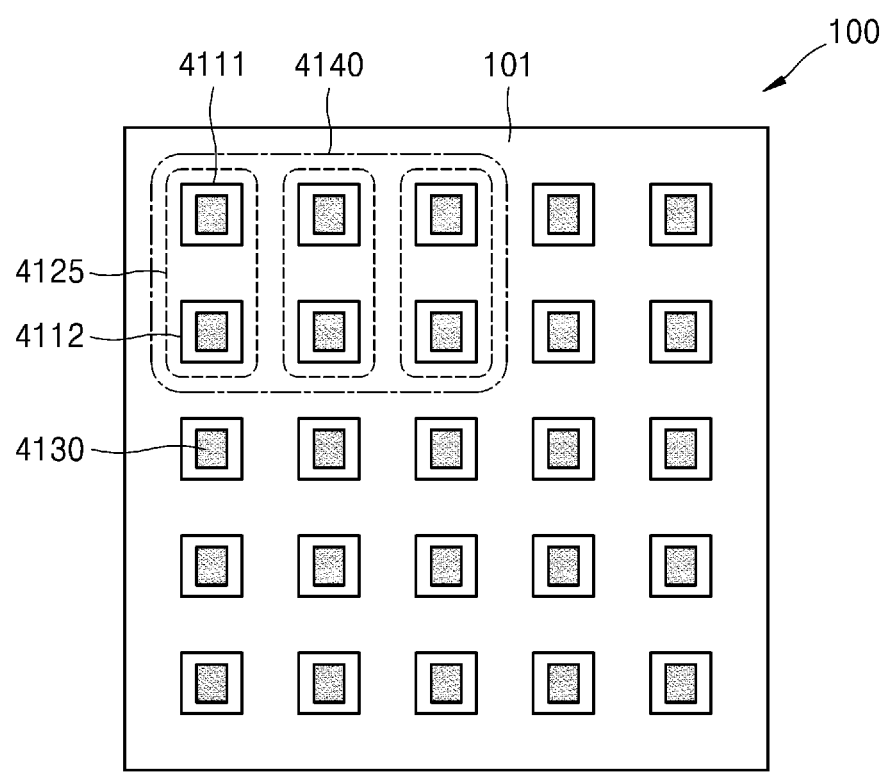
FIG. 39 illustrates a display transfer structure according to an example embodiment.

FIG. 39 illustrates a display transfer structure 100 according to an example embodiment.

The example display transfer structure 100 may include a transfer substrate 101 including a plurality of grooves and a micro light emitting device 4130 provided on a plurality of grooves. In the example embodiment, the transfer substrate 101 may include a plurality of regions 4125 corresponding to a sub-pixel and may include a plurality of grooves in each of the plurality of regions 4125. A pixel may represent a basic unit representing color in a display apparatus. Reference numeral 4140 represents a region corresponding to a pixel. For example, one pixel may include a first color light, a second color light, and a third color light. For example, the first color light may include red light, the second color light may include green light, and the third color light may include blue light. The pixel may include a plurality of sub-pixels that emit each color light. For example, the pixel may include a first sub-pixel that emits the first color light, a second sub-pixel that emits the second color light, and a third sub-pixel that emits the third color light. One or more micro light emitting devices 4130 may be provided in a region 4125 corresponding to each sub-pixel.

For example, the transfer substrate 101 may include a first groove 4111 and a second groove 4112 in a plurality of regions 4125. The micro light emitting devices 4130 may be provided on the first groove 4111 and the second groove 4112, respectively. However, the micro light emitting devices 4130 may be omitted in the region 4125 corresponding to each sub-pixel. For example, the micro light emitting devices 4130 may be provided on the first groove 4111, and the micro light emitting devices 4130 may be omitted in the second groove 4112. In this case, the micro light emitting devices 4130 are provided on the first groove 4111 and thus, there is no problem in a pixel operation.

In this way, when the plurality of grooves 4111 and 4112 are provided in the region 4125 corresponding to each sub-pixel, although the micro light emitting devices 4130 are omitted in any one of the plurality of grooves 4111 and 4112, the micro light emitting devices 4130 may be provided on the other grooves so that an error rate may be reduced and a repair process may be omitted.

For example, the micro light emitting devices 4130 may have the size of 200 μm or less. Here, the size may represent a maximum diameter of a cross-section of each of the micro light emitting devices 4130. The cross-section may represent a cross-section perpendicular to a direction in which light is emitted from the micro light emitting device 4130. The micro light emitting devices 4130 may have various shapes such as a triangular cross-section, a rectangular cross-section, a circular cross-section, and the like. The grooves 4111 and 4112 may have, for example, the size into which the micro light emitting devices 4130 may fit, and may have a size corresponding to the number of the micro light emitting devices 4130 as necessary. The grooves 4111 and 4112 may have various shapes, such as a triangular cross-section, a rectangular cross-section, a circular cross-section, and the like.

Figure 40:
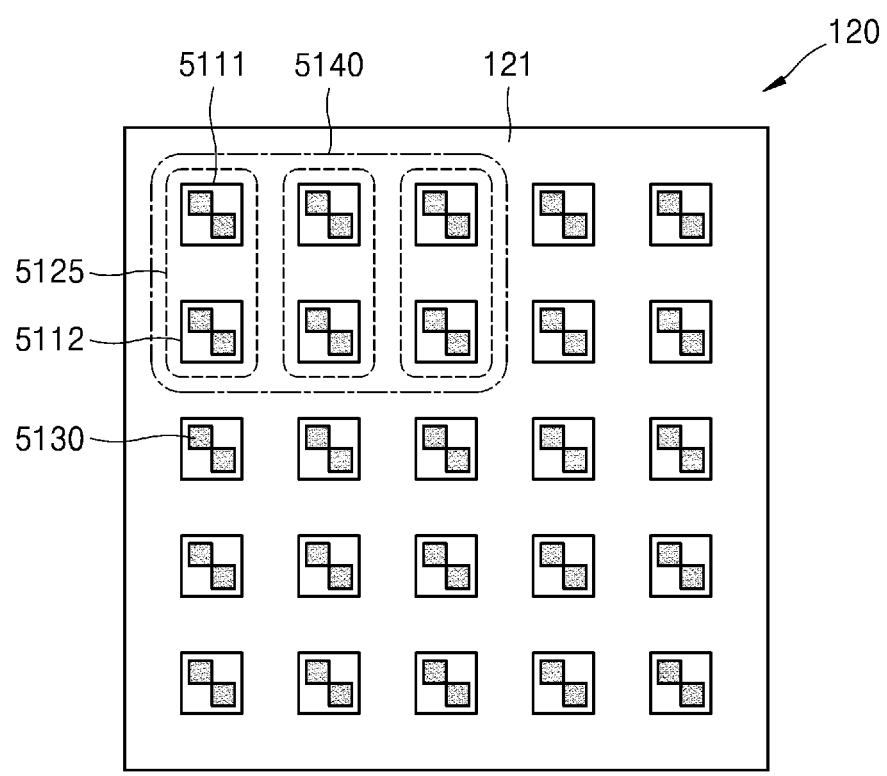
FIG. 40 illustrates a display transfer structure according to another example embodiment.

FIG. 40 illustrates a display transfer structure 120 according to another example embodiment.

The display transfer structure 120 may include a transfer substrate 121 including a plurality of grooves and micro light emitting devices 5130 provided on the plurality of grooves. In the example embodiment, the transfer substrate 121 may include a plurality of regions 5125 corresponding to a sub-pixel and may include a plurality of grooves 5111 and 5112 in each of the plurality of regions 5125.

The plurality of grooves 5111 and 5112 may have a size at which the plurality of micro light emitting devices 5130 may be accommodated. Here, the size may represent the cross-sectional area of the groove.

For example, the transfer substrate 121 may include a first groove 5111 and a second groove 5112 in each of the plurality of regions 5125. The first groove 5111 and the second groove 5112 may have a size in which two or more micro light emitting devices 5130 may fit. For example, two micro light emitting devices 5130 may enter the first groove 5111, and two micro light emitting devices 5130 may enter the second groove 5112. In this way, the possibility of defects for each pixel due to the omission of micro light emitting devices may be reduced, and the repair process may be omitted. Reference numeral 5140 represents a region corresponding to a pixel.

Figure 41:
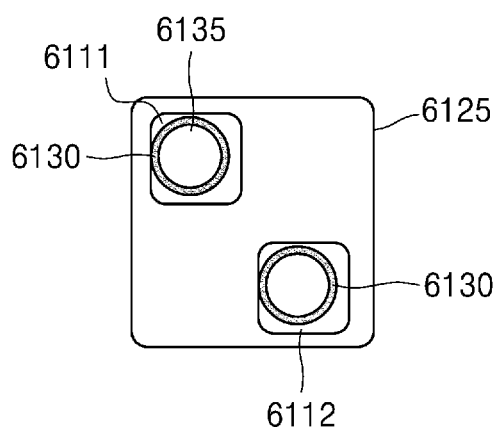
FIGS. 41 through 43 are enlarged views of various examples in which micro light emitting devices are arranged in a region corresponding to one sub-pixel that may be applied to an example transfer substrate according to example embodiments.
Figure 42:
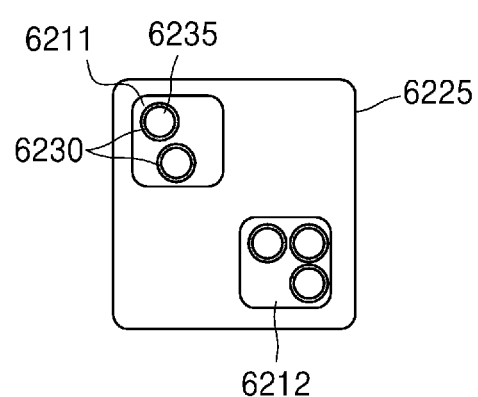
Figure 43:
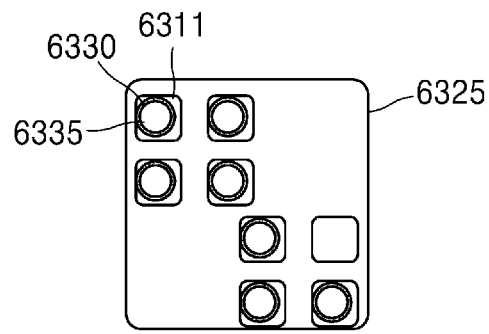

FIGS. 41 through 43 are enlarged views of various examples in which micro light emitting devices are arranged in a region corresponding to one sub-pixel that may be applied to an example transfer substrate (121 of FIG. 40).

Referring to FIG. 41, first and second grooves 6111 and 6112 may be provided in a region 6125 corresponding to a sub-pixel, and micro light emitting devices 6130 may be provided in each of the first and second grooves 6111 and 6112. The micro light emitting devices 6130 may have circular cross-sections, and at least one electrode 6135 may be arranged toward upper openings of the first and second grooves 6111 and 6112.

In the example embodiment, the first and second grooves 6111 and 6112 may be arranged in the region 6125 in a diagonal direction. When the first and second grooves 6111 and 6112 are arranged in the diagonal direction, the possibility of omission of the micro light emitting devices 6130 when the micro light emitting devices 6130 are aligned, may be relatively reduced compared to the case where the first and second grooves 6111 and 6112 are arranged in a line.

Referring to FIG. 42, first and second grooves 6211 and 6212 may be provided in a region 6225 corresponding to the sub-pixel, and a plurality of micro light emitting devices 6230 may be provided in each of the first and second grooves 6211 and 6212. The first and second grooves 6211 and 6212 may have a size at which the plurality of micro light emitting devices 6230 may be accommodated. At least one electrode 6235 may be arranged toward the upper openings of the first and second grooves 6211 and 6212. Here, the first and second grooves 6211 and 6212 may be arranged in the region 6225 in the diagonal direction. However, the positions of the first and second grooves 6211 and 6212 are not limited thereto and may be variously modified.

Referring to FIG. 43, eight grooves 6311 may be provided in the region 6325 corresponding to the sub-pixel. Micro light emitting devices 6330 may be provided in each of eight grooves 6311. At least one electrode 6335 may be arranged toward the upper opening of each groove 6311. In this way, when the number of grooves 6311 is large in the region 6325 corresponding to the sub-pixel, even if the micro light emitting device is omitted in some grooves, there is no problem in the pixel operation, so that the pixel defect rate may be reduced and the repair process may be reduced.

Figure 44:
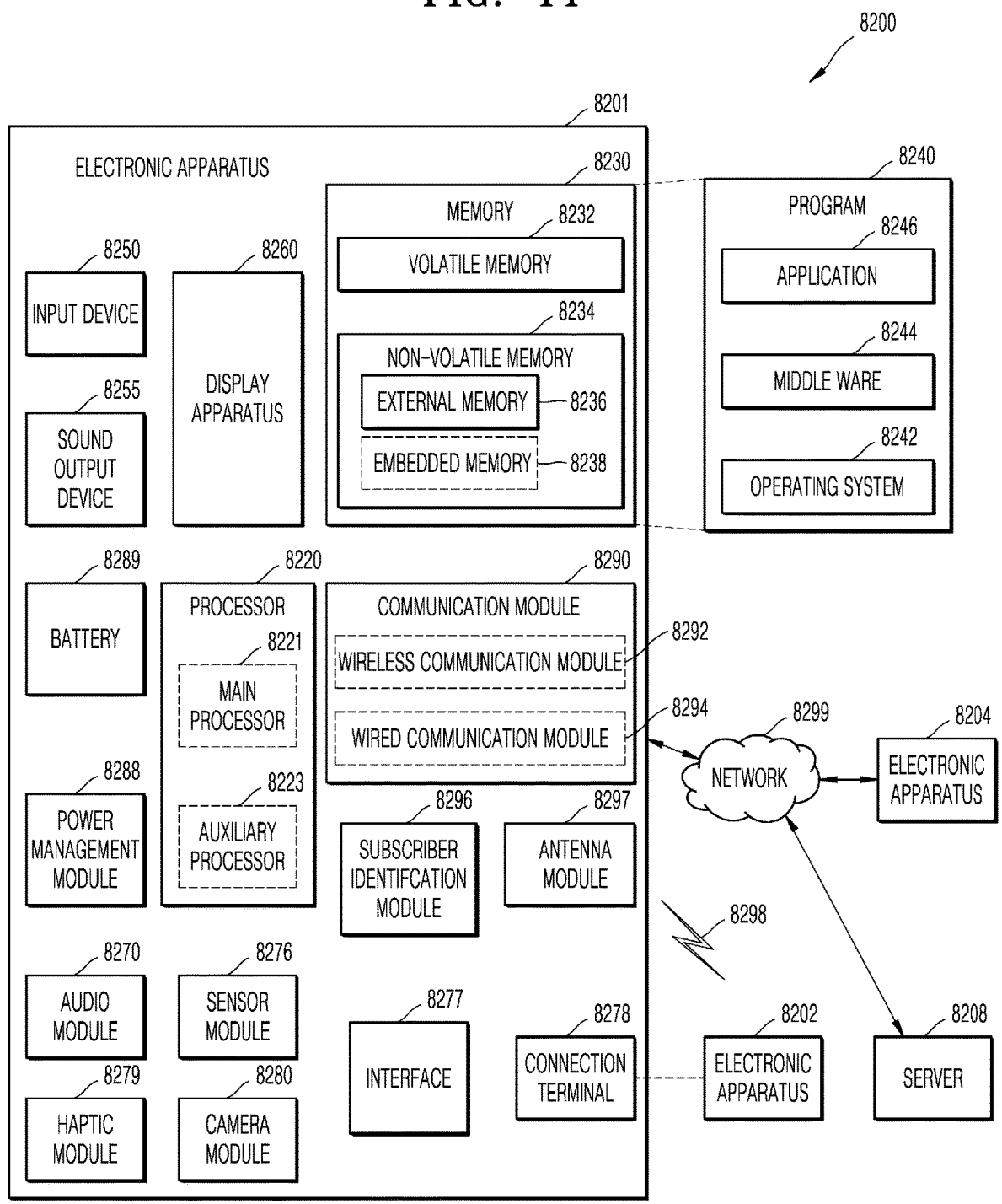
FIG. 44 is a block diagram of an electronic apparatus including a display apparatus according to an example embodiment.

FIG. 44 is a block diagram of an electronic apparatus including a display apparatus according to an example embodiment.

Referring to FIG. 44, an electronic apparatus 8201 may be provided in a network environment 8200. In the network environment 8200, the electronic apparatus 8201 may communicate with other electronic apparatus 8202 via a first network 8298 (a near-field wireless communication network, etc.) or may communicate with other electronic apparatus 8204 and/or a server 8208 via a second network 8299 (remote wireless communication network, etc.). The electronic apparatus 8201 may communicate with the electronic apparatus 8204 via the server 8208. The electronic apparatus 8201 may include a processor 8220, memory 8230, an input device 8250, a sound output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, a connection terminal 8278, and/or an antenna module 8297. Some of these components may be omitted or other components may be added to the electronic apparatus 8201. Some of these components may be implemented with one integrated circuit. For example, the sensor module 8276 (fingerprint sensor, iris sensor, illuminance sensor, etc.) may be implemented by being embedded in the display apparatus 8260 (display, etc.).

The processor 8220 may execute software (program 8240, etc.) to control one or a plurality of other components (hardware, software, etc.) from among the electronic apparatus 8201 connected to the processor 8220 and may perform various data processing or arithmetic operations. As part of data processing or arithmetic operations, the processor 8220 may load commands and/or data received from other components (sensor module 8276, communication module 8290, etc.) to volatile memory 8232, may process the commands and/or data stored in the volatile memory 8232 and may store resultant data in non-volatile memory 8234. The processor 8220 may include a main processor 8221 (central processing unit, application processor, etc.) and an auxiliary processor 8223 (graphic processing unit, image signal processor, sensor hub processor, communication processor, etc.) operable independently of or together with the main processor 8221. The auxiliary processor 8223 may use less power than the main processor 8221 and may perform specialized functions.

The auxiliary processor 8223 may control functions and/or states related to some (display apparatus 8260, sensor module 8276, communication module 8290, etc.) of components of the electronic apparatus 8201 instead of the main processor 8221 while the main processor 8221 is in an inactive state (sleep state), or together with the main processor 8221 while the main processor 8221 is in an active state (application execution state). The auxiliary processor 8223 (image signal processor, communication processor, etc.) may be implemented as part of functionally-related other components (camera module 8280, communication module 8290, etc.).

The memory 2230 may store various data required by components (processor 8220, sensor module 8276, etc.) of the electronic apparatus 8201. The data may include, for example, software (program 8240, etc.) and input data and/or output data for commands related thereto. The memory 8230 may include volatile memory 8232 and/or non-volatile memory 8234. According to an example embodiment, the non-volatile memory 8234 may include an external memory 8236 and/or an embedded memory 8238.

The program 8240 may be stored in the memory 8230 as software and may include an operation system 8242, a middle ware 8244 and/or an application 8246.

The input device 8250 may receive commands and/or data to be used in components (processor 8220, etc.) of the electronic apparatus 8201 from the outside (user, etc.) of the electronic apparatus 8201. The input device 8250 may include a remote controller, a microphone, a mouse, a keyboard, and/or a digital pen (stylus pen, etc.).

The sound output device 8255 may output a sound signal to the outside of the electronic apparatus 8201. The sound output device 8255 may include a speaker and/or receiver. The speaker may be used for general purpose such as multimedia playback or recording playback, and the receiver may be used to receive incoming calls. The receiver may be coupled as part of the speaker or may be implemented with an independent separate device.

The display apparatus 8260 may visually provide information to the outside of the electronic apparatus 8201. The display apparatus 8260 may include a display, a hologram device, or a projector and a control circuit for controlling the corresponding apparatus. The display apparatus 8260 may include various types of display apparatuses including the micro light emitting device array described with reference to FIGS. 1 through 43. The display apparatus 8260 may include a touch circuitry set to detect touch and/or a sensor circuit (pressure sensor, etc.) set to measure the intensity of force generated by touch.

The audio module 8270 may convert sound into an electrical signal or may covert an electrical signal into sound. The audio module 8270 may acquire sound through the input device 8250 or may output sound through the sound output device 8255, and/or a speaker and/or headphone of other electronic apparatus (electronic apparatus 8102, etc.) directly or wirelessly connected to the electronic apparatus 8201.

The sensor module 8276 may detect the operating state (power, temperature, etc.) of the electronic apparatus 8201 or the outside environment state (user state, etc.) and may generate an electrical signal and/or data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used so that the electronic apparatus 8201 may be directly or wirelessly connected to other electronic apparatus (electronic apparatus 8102, etc.). The interface 8277 may include a high definition multimedia interface (HDMI), a universal serial bus (USB) interface, a secure digital (SD) card interface, and/or an audio interface.

A connection terminal 8278 may include a connector via which the electronic apparatus 8201 may be physically connected to other electronic apparatus (electronic apparatus 8102, etc.). The connection terminal 8278 may include a HDMI connector, a USB connector, a SD card connector, and/or an audio connector (headphone connector, etc.).

The haptic module 8279 may convert an electrical signal into a mechanical stimulus (vibration, movement, etc.) or an electrical stimulus that may be recognized by the user through tactile or motion sensations. The haptic module 8279 may include a motor, a piezoelectric element, and/or an electrical stimulus device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject that is a target of image capturing.

The power management module 8288 may manage power supplied to the electronic device 8201. The power management module 8388 may be implemented as part of a power management integrated circuit (PMIC).

The battery 8289 may supply power to components of the electronic apparatus 8201. The battery 8289 may include a non-rechargeable primary cell, a rechargeable secondary cell, and/or a fuel cell.

The communication module 8290 may establish a direct (wired) communication channel and/or a wireless communication channel between the electronic apparatus 8201 and other electronic apparatuses (electronic apparatus 8102, electronic apparatus 8104, server 8108, etc.) and may support performing communication through the established communication channel. The communication module 8290 may include one or more communication processor that is operated independently of the processor 8220 (application processor, etc.) or supports direct communication and/or wireless communication. The communication module 8290 may include a wireless communication module 8292 (cellular communication module, near-field wireless communication module, a global navigation satellite system (GNSS), etc.) communication module and/or a wired communication module 8294 (local area network (LAN) communication module, power line communication module, etc.). The corresponding communication module from among these communication modules may communicate with other electronic apparatuses via a first network 8298 (near-field communication network such as Bluetooth, WiFi direct or infrared data association (IrDA)) or a second network 8299 (remote communication network such as cellular network, Internet, or computer network (LAN, WAN, etc.). These various types of communication modules may be integrated into one component (a single chip, etc.), or may be implemented as a plurality of separate components (multiple chips). The wireless communication module 8292 may check and authenticate the electronic apparatus 8201 in a communication network such as the first network 8298 and/or the second network 8299 using subscriber information (internal mobile subscriber identifier (IMSI), etc.) stored in the subscriber identification module 8296.

The antenna module 8297 may transmit or receive signal and/or power to or from the outside (other electronic apparatuses, etc.). The antenna may include a radiator made of a conductive pattern formed on a substrate (PCB, etc.). The antenna module 8297 may include one or a plurality of antennas. When the plurality of antennas are included, an antenna suitable for a communication method used in a communication network such as the first network 8298 and/or the second network 8299 may be selected from among the plurality of antennas by the communication module 8290. Signal and/or power may be transmitted or received between the communication module 8290 and other electronic apparatuses via the selected antenna. Parts (RFIC, etc.) other than the antenna may be included as part of the antenna module 8297.

Some of the components may be connected to each other via a communication method (bus, general purpose input and output (GPIO), serial peripheral interface (SPI), mobile industry processor interface (MIPI), etc.) between peripheral devices and may exchange signals (commands, data, etc.).

The command or data may be transmitted or received between the electronic apparatus 8201 and the external electronic apparatus 8204 via the server 8108 connected to the second network 8299. Other electronic apparatuses 8202 and 8204 may be the same or different types of apparatuses as or from the electronic apparatus 8201. All or part of operations executed by the electronic apparatus 8201 may be executed by one or more apparatuses from among other electronic apparatuses 8202, 8204, and 8208. For example, when the electronic apparatus 8201 needs to perform a certain function or service, instead of executing the function or service by itself, one or more other electronic apparatuses may be requested to perform the function or part or all of the service. One or more other electronic apparatuses that receive the request may execute an additional function or service related to the request and may transmit the result of execution to the electronic apparatus 8201. To this end, cloud computing, distributed computing, and/or client-server computing technology may be used.

Figure 45:
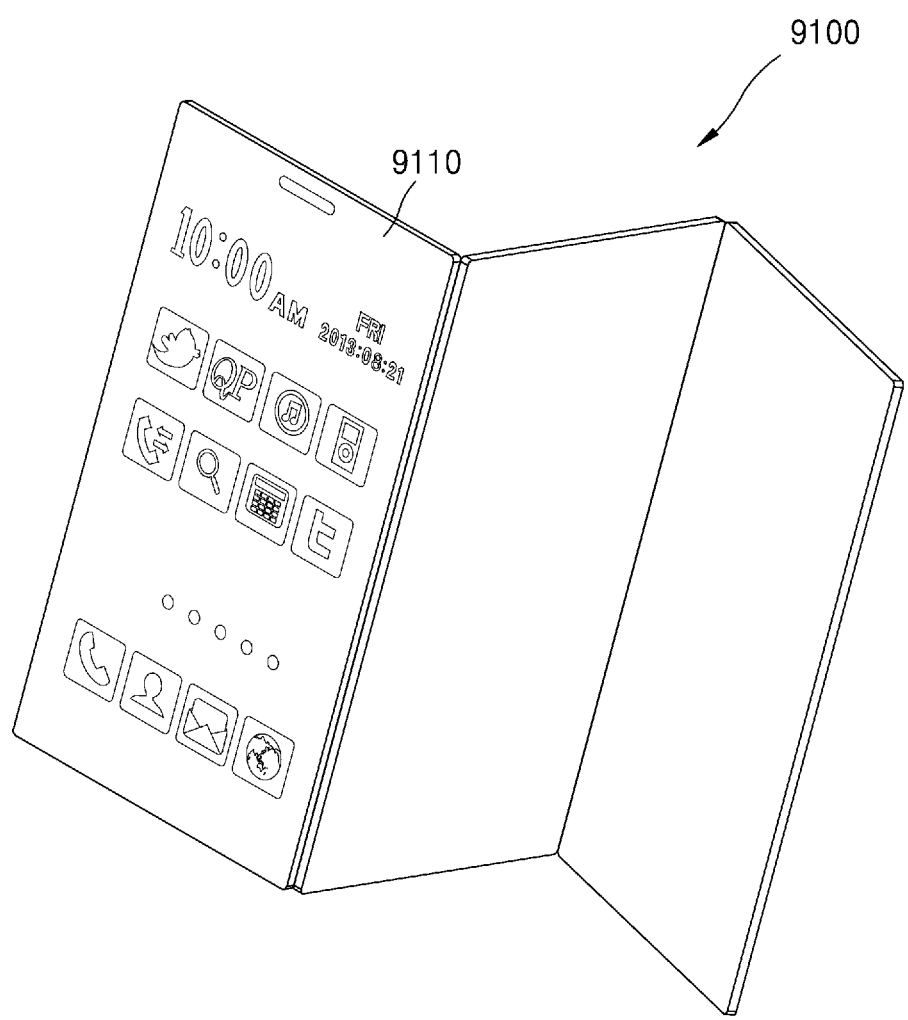
FIG. 45 illustrates an example of applying an electronic apparatus according to an example embodiment to a mobile apparatus.

FIG. 45 illustrates an example in which an electronic apparatus according to an example embodiment is applied to a mobile apparatus 9100.

Referring to FIG. 45, the mobile apparatus 9100 may include a display apparatus 9110 according to an example embodiment. The display apparatus 9110 may include various types of display apparatuses including the micro light emitting device array described with reference to FIGS. 1 through 43 according to other example embodiments. The display apparatus 9110 may have a foldable structure and may be applied to a multi-folder display, for example. Here, the mobile apparatus 9110 is shown as a folder-type display but may be applied to a general flat panel display.

Figure 46:
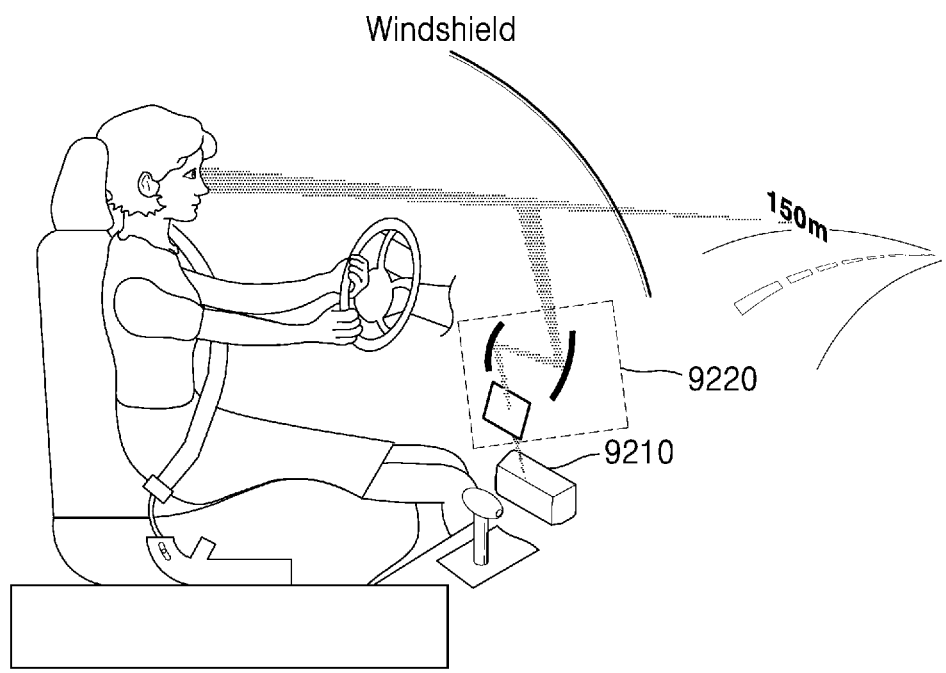
FIG. 46 illustrates an example of applying a display apparatus according to an example embodiment to a vehicle.

FIG. 46 illustrates an example in which a display apparatus according to an example embodiment is applied to a vehicle. According to an example embodiment, the vehicle may be a car.

Referring to FIG. 46, the display apparatus may be applied to a head up display apparatus for a car. The head up display apparatus may include a display apparatus 9210 provided in one region of the car and at least one or more optical path changing members 9220 for converting the path of light so that a video generated by the display apparatus 9210 may be seen by a driver. The display apparatus 9210 may include various types of display apparatuses including the micro light emitting device array described with reference to FIGS. 1 through 43 according to other example embodiments.

Figure 47:
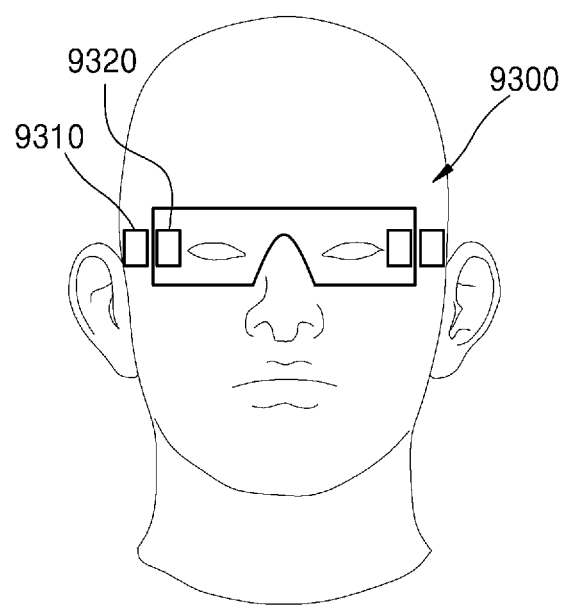
FIG. 47 illustrates an example of applying a display apparatus according to an example embodiment to augmented reality glasses or virtual reality glasses.

FIG. 47 illustrates an example in which a display apparatus according to an example embodiment is applied to augmented reality glasses or virtual reality glasses.

Referring to FIG. 47, augmented reality glasses 9300 may include a projection system 9310 for forming an image and at least one element 9320 for guiding an image from projection system 9310 to enter the user's eyes. The projection system 9310 may include various types of projection systems including the micro light emitting device array described with reference to FIGS. 1 through 43 according to other example embodiments.

Figure 48:
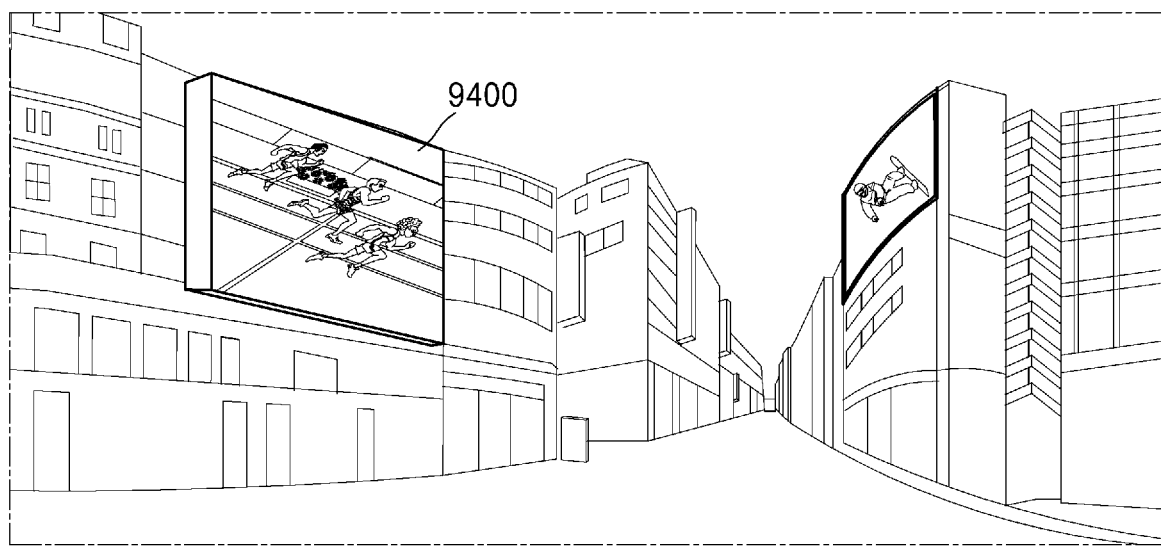
FIG. 48 illustrates an example of applying a display apparatus according to an example embodiment to a large signage.

FIG. 48 illustrates an example in which a display apparatus according to an example embodiment is applied to a large signage.

Referring to FIG. 48, a signage 9400 may be used in outdoor advertisement using a digital information display and may control the contents of advertisement through a communication network. The signage 9400 may be implemented with the electronic apparatus 8201 described with reference to FIG. 44, for example.

Figure 49:
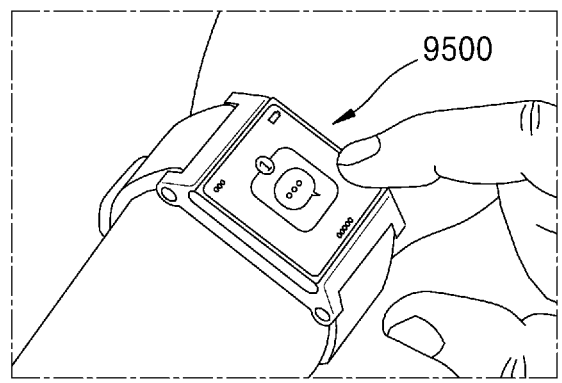
FIG. 49 illustrates an example of applying a display apparatus according to an example embodiment to a wearable display.

FIG. 49 illustrates an example in which a display apparatus according to an example embodiment is applied to a wearable display.

Referring to FIG. 49, a wearable display 9500 may include the micro light emitting device array described with reference to FIGS. 1 through 43 and may be implemented through the electronic apparatus 8201 described with reference to FIG. 45.

The display apparatus according to an example embodiment may be applied to various products such as a rollable TV, a stretchable display, etc.

According to various example embodiments of the disclosure, there are provided a micro light emitting device arrays formed by using a display transfer structure including a plurality of micro light emitting devices aligned by a wet alignment method and alignment marks and a driving circuit board having the alignment marks formed thereon, and methods of manufacturing the same.

In the micro light emitting device wet alignment method according to various example embodiments of the disclosure, the micro light emitting devices may be efficiently aligned to a large area by a wet method. Since the micro light emitting devices may be rapidly transferred to a large area, they may be applied to a large-area display apparatus, and the cost of transferring the micro light emitting devices to a large area may be reduced so that the cost of the display apparatus may be reduced.

A large-area micro light emitting device array may be efficiently manufactured using a display transfer structure including alignment marks and a driving circuit board according to various example embodiments of the disclosure. Such a large-area micro light emitting array may be applied to various types of display apparatuses. Thus, the cost of the display apparatus may be reduced.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A micro light emitting device array comprising:
a substrate comprising a plurality of sub-regions;
a plurality of micro light emitting devices arranged on the plurality of sub-regions;
a plurality of driving circuits arranged on a first surface of the substrate to be electrically connected to the plurality of micro light emitting devices; and
a plurality of alignment marks arranged on the first surface of the substrate,
wherein at least two alignment marks from among the plurality of alignment marks are arranged in each of the plurality of sub-regions, and
wherein each of the plurality of driving circuits are respectively bonded to one of the plurality of micro light emitting devices.

2. The micro light emitting device array of claim 1, wherein the at least two alignment marks are symmetrically arranged in each of the plurality of sub-regions.

3. The micro light emitting device array of claim 1, wherein areas of the plurality of sub-regions are same.

4. The micro light emitting device array of claim 1, wherein a first number of a plurality of micro light emitting devices arranged in a first subregion from among the plurality of sub-regions and a second number of a plurality of micro light emitting devices arranged in a second sub-region from among the plurality of sub-regions are same.

5. The micro light emitting device array of claim 1, wherein the plurality of driving circuits comprises a first array of driving circuits arranged in a first sub-region, among the plurality of sub-regions, and a second array of driving circuits arranged in a second sub-region, among the plurality of sub-regions.

6. The micro light emitting device array of claim 5, wherein the first array of driving circuits and the second array of driving circuits are arranged in a matrix form.

7. The micro light emitting device array of claim 6, wherein the at least two alignment marks arranged in each of the plurality of sub-regions comprises:
a first alignment mark provided above a first row of driving circuits in the first sub-region,
a second alignment mark provided below a last row of driving circuits in the first sub-region,
a third alignment mark provided above a first row of driving circuits in the second sub-region, and
a fourth alignment mark provided below a last row of driving circuits in the second sub-region.

* * * * *